United States Patent
Ono et al.

(10) Patent No.: US 7,986,200 B2
(45) Date of Patent: Jul. 26, 2011

(54) ACOUSTIC WAVE FILTER INCLUDING FIRST AND SECOND MULTIMODE FILTERS WITH DIFFERENT APERTURE LENGTHS

(75) Inventors: Satoru Ono, Yokohama (JP); Yasushi Kuroda, Yokohama (JP)

(73) Assignee: Taiyo Yuden Co., Ltd., Taito-ku, Tokyo (JP)

( * ) Notice: Subject to any disclaimer, the term of this patent is extended or adjusted under 35 U.S.C. 154(b) by 222 days.

(21) Appl. No.: 12/333,927

(22) Filed: Dec. 12, 2008

(65) Prior Publication Data

US 2009/0153269 A1 Jun. 18, 2009

(30) Foreign Application Priority Data

Dec. 14, 2007 (JP) ................................. 2007-323892

(51) Int. Cl.
*H03H 9/64* (2006.01)
(52) U.S. Cl. ........................................ 333/193; 333/195
(58) Field of Classification Search .................. 333/133, 333/193–196; 310/313 B, 313 D
See application file for complete search history.

(56) References Cited

U.S. PATENT DOCUMENTS

| | | | |
|---|---|---|---|
| 5,874,869 A | 2/1999 | Ueda et al. | |
| 5,936,488 A * | 8/1999 | Taguchi et al. | 333/195 |
| 6,271,739 B1 * | 8/2001 | Ueda et al. | 333/193 |
| 6,353,372 B1 * | 3/2002 | Baier et al. | 333/195 |
| 6,606,016 B2 * | 8/2003 | Takamine | 333/133 |
| 7,019,435 B2 * | 3/2006 | Nakaya et al. | 310/313 D |
| 7,242,268 B2 * | 7/2007 | Hagiwara et al. | 333/133 |
| 2002/0017969 A1 | 2/2002 | Takamine | |
| 2002/0135267 A1 | 9/2002 | Takamine | |
| 2007/0126531 A1 | 6/2007 | Yata | |
| 2008/0122554 A1 | 5/2008 | Harada et al. | |
| 2008/0169882 A1 * | 7/2008 | Ono et al. | 333/133 |
| 2008/0191812 A1 * | 8/2008 | Uejima et al. | 333/101 |

FOREIGN PATENT DOCUMENTS

| | | |
|---|---|---|
| CN | 1184378 A | 6/1998 |
| CN | 1325184 A | 12/2001 |
| CN | 101006640 A | 7/2007 |
| CN | 101088228 A | 12/2007 |
| JP | 10-163803 A | 6/1998 |
| JP | 11-068512 A | 3/1999 |
| JP | 3480445 B2 | 10/2003 |
| JP | 2004-166258 A | 6/2004 |
| JP | 2006-136005 A | 5/2006 |
| WO | WO-2006/070616 A1 | 7/2006 |
| WO | WO-2006/087875 A1 | 8/2006 |
| WO | WO 2007/088732 * | 8/2007 |

* cited by examiner

*Primary Examiner* — Barbara Summons
(74) *Attorney, Agent, or Firm* — Arent Fox LLP

(57) ABSTRACT

An acoustic wave filter includes: a first acoustic wave filter having a first group of multimode filters connected, a first unbalanced input node and two first balanced output nodes, a first multimode filter among the first group of multimode filters being connected to the two first balanced output nodes; and a second acoustic wave filter having a second group of multimode filters, a second unbalanced input node and two second balanced output nodes, a second multimode filter among the second group of multimode filters having an aperture length different from that of the first multimode filter and a connection with the two second balanced output nodes, the first and second multimode filters having different pass bands. One of the two first balanced output nodes and one of the two second balanced output nodes are unified, and the other first balanced output node and the other second balanced output node are unified.

20 Claims, 19 Drawing Sheets

US 7,986,200 B2

ACOUSTIC WAVE FILTER INCLUDING FIRST AND SECOND MULTIMODE FILTERS WITH DIFFERENT APERTURE LENGTHS

CROSS-REFERENCE TO RELATED APPLICATION

This application is based upon and claims the benefit of priority of the prior Japanese Patent Application No. 2007-323892, filed on Dec. 14, 2007, the entire contents of which are incorporated herein by reference.

FIELD

The present invention generally relates to acoustic wave filters, and more particularly, to an acoustic wave filter having a multimode filter.

BACKGROUND

Recently, portable terminal equipment such as cellular phones and portable information terminals has become widely used due to the development of mobile communications systems. For example, multi-band cellular phones having two or more communication systems have been developed. Portable devices such as multi-band cellular phones are required to have a wideband filter capable of handing the bands of the two or more communication systems.

However, it is difficult to realize a filter that covers the two or more bands and low insertion loss. Therefore, an alternative filter is used in which multiple acoustic wave filters are connected in parallel and each of the filters covers the communication band of the respective communication system.

Japanese Patent Application Publication No. 11-68512 discloses a one-input two-unbalanced-output filter using two acoustic wave filters. Japanese Patent No. 3480445 discloses a one-input two-balanced-output filter using two acoustic wave filters. In the two acoustic wave filters connected to one input in parallel, these acoustic wave filters allow signals in the respective pass bands to pass therethrough. In order to cut off signals out of the pass bands, one of the filters is in a high-impedance state in the pass band of the other filter.

In the above-mentioned prior art documents, a series resonator is provided between the particular acoustic wave filter and the input in order to adjust the impedance so that one of the filters is in the high-impedance state in the pass band of the other filter.

However, the insertion of the series resonator results in insertion loss and prevents downsizing.

SUMMARY

According to an aspect of the present invention, there is provided an acoustic wave device having reduced insertion loss and a reduced size.

According to another aspect of the present invention, there is provided an acoustic wave filter including: a first acoustic wave filter having a first group of multimode filters connected, a first unbalanced input node and two first balanced output nodes, a first multimode filter among the first group of multimode filters being connected to the two first balanced output nodes; and a second acoustic wave filter having a second group of multimode filters, a second unbalanced input node and two second balanced output nodes, a second multimode filter among the second group of multimode filters having an aperture length different from that of the first multimode filter and a connection with the two second balanced output nodes, the first and second multimode filters having different pass bands, one of the two first balanced output nodes and one of the two second balanced output nodes being unified, and the other first balanced output node and the other second balanced output node being unified.

DESCRIPTION OF EMBODIMENTS

A description is given of embodiments of the present invention with reference to the accompanying drawings.

First Embodiment

Figure 1:
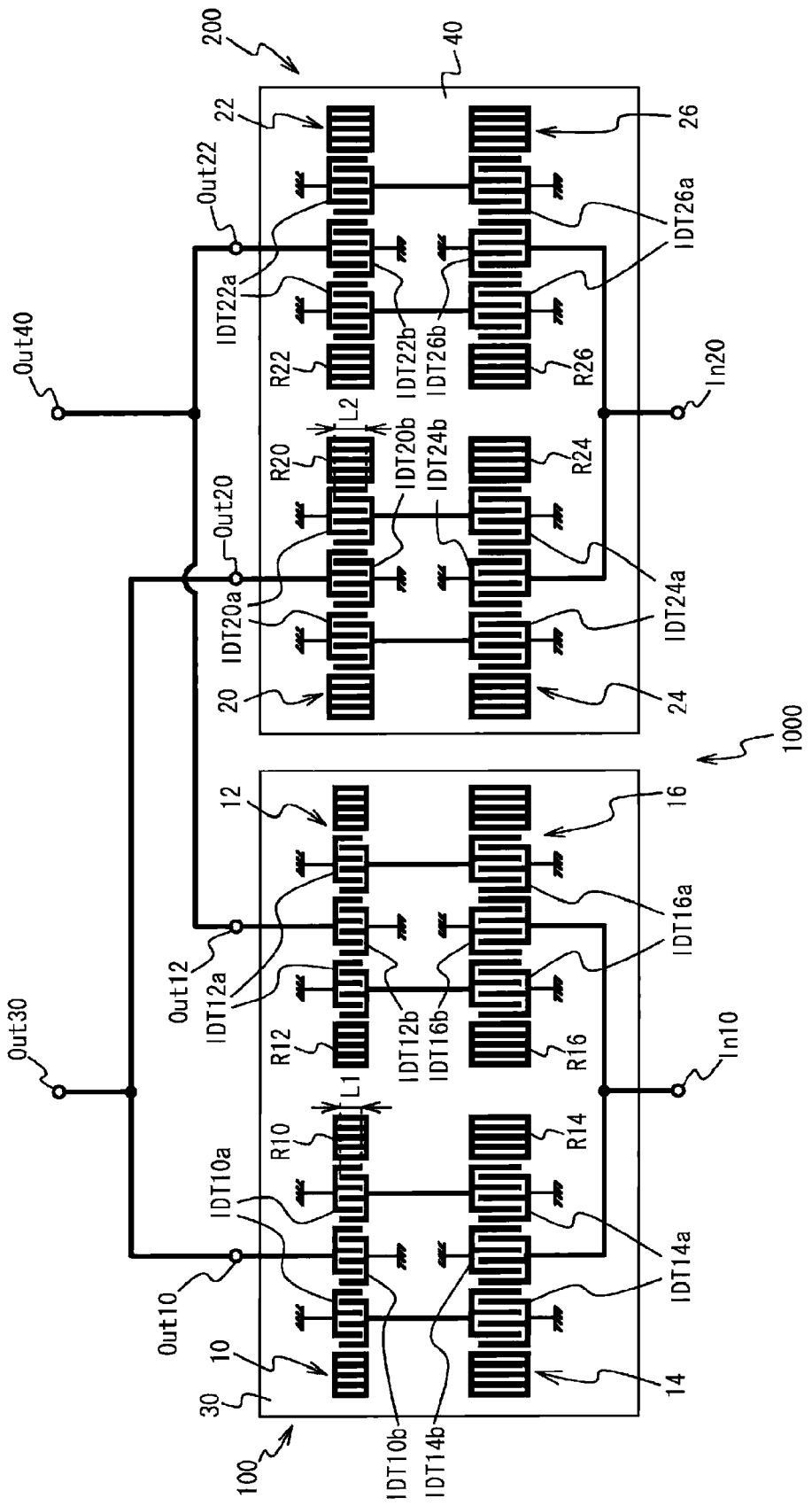
FIG. 1 is a plan view of an acoustic wave device in accordance with a first embodiment.

FIG. 1 is a plan view of a surface acoustic wave filter 1000 in accordance with a first embodiment. The SAW filter 1000 includes a first acoustic wave filter 100, and a second acoustic wave filter 200 that has a pass band different from that of the first acoustic wave filter 100.

The first acoustic wave filter 100 is now described. The filter 100 has a group of multimode filters 10, 12, 14 and 16. The multimode filters 14 and 16 connected to a first unbalanced input node In10 in parallel. The first multimode filter 10 is connected to the multimode filter 14 in series, and the first multimode filter 12 is connected to the multimode filter 16 in series. A first balanced output node Out10 is connected to the first multimode filter 10, and a first balanced output node Out12 is connected to the first multimode filter 12.

The first multimode filter 10 is configured so that an output IDT (interdigital transducer) 10*b* connected to the first balanced output node Out 10 is arranged in the center, and input IDTs 10*a* are arranged at opposite sides of the output IDT 10*b*, and that reflectors R10 are arranged outside of the input IDTs 10*a*. The multimode filter 14 is configured so that two output IDTs 14*a* are respectively arranged at opposite sides of an input IDT 14*b* connected to a first unbalanced input node In10 and reflectors R14 are arranged outside of the output IDTs 14*a*. The first multimode filter 12 has a configuration similar to that of the first multimode filter 10, and the multimode filter 16 has a configuration similar to that of the multimode filter 14. The filters 10, 12, 14 and 16 may be configured by a single piezoelectric substrate 30, which may typically be made of lithium niobate or lithium tantalate.

The multimode filters 14 and 16 have different arrangements of IDT electrode fingers. This makes it possible for the filters 14 and 16 to output the respective signals that are 180 degrees out of phase. The signals having a phase difference of 180 degrees are output from the first balanced output nodes Out10 and Out12.

The second acoustic wave filter 200 is configured as follows. The second acoustic wave filter 200 has a group of multimode filters 20, 22, 24 and 26. The multimode filters 24 and 26 are connected to a second unbalanced input node In20 in parallel. The second multimode filter 20 is connected to the multimode filter 24 in series, and the second multimode filter 22 is connected to the multimode filter 26 in series. A second balanced output node Out20 is connected to the second multimode filter 20, and a second balanced output node Out22 is connected to the second multimode filter 22.

The second multimode filters 20 and 22 are composed of output IDTs, input IDTs and reflectors R like the first multimode filter 10. The multimode filters 24 and 26 have configurations similar to that of the multimode filter 14. The second multimode filters 20 and 22 and the multimode filters 24 and 26 are formed on an identical piezoelectric substrate 40.

The multimode filters 24 and 26 have different arrangements of IDT electrode fingers. This makes it possible for the filters 24 and 26 to output the respective signals that are 180 degrees out of phase. The signals having a phase difference of 180 degrees are output from the second balanced output nodes Out20 and Out22.

Figure 2:
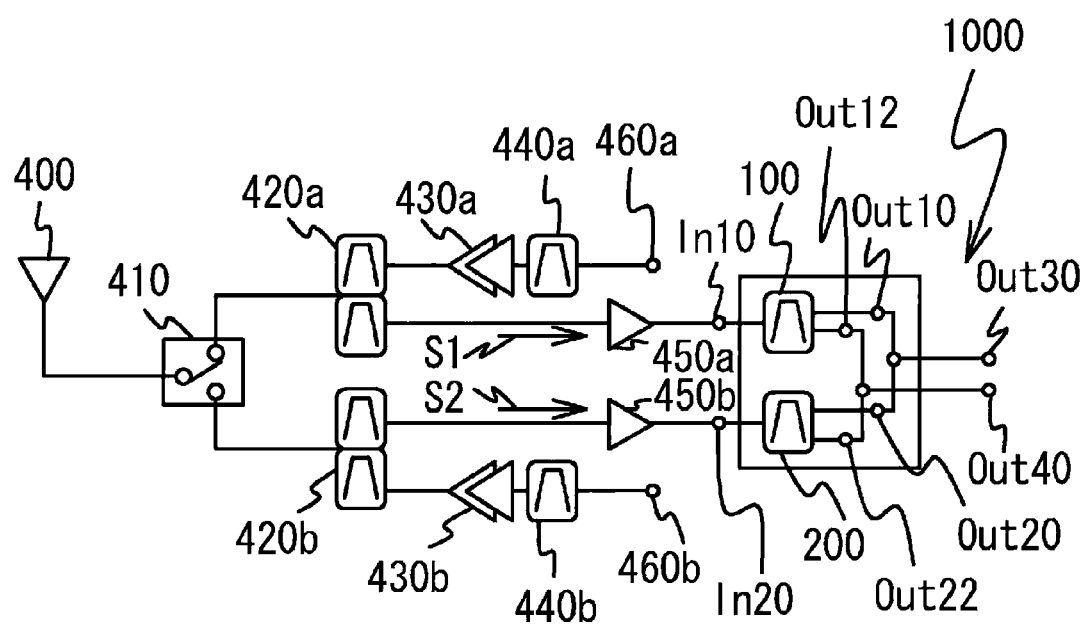
FIG. 2 is a block diagram of a communication apparatus using acoustic wave devices in accordance with the first embodiment.

FIG. 2 is a block diagram of a communication apparatus using the acoustic wave filter 1000. An amplifier 430*a* and a filter 440*a* are provided between a transmission node 460*a* and a duplexer 420*a*. The duplexer 420*a* is coupled to the first unbalanced input node In10 of the filter 1000 via an amplifier 450*a*. Due to the presence of the duplexer 420*a*, a signal transmitted via the transmission node 460*a* is not sent to the first unbalanced input node In10 but is sent to an antenna 400 via a switch 410. An amplifier 430*b* and a filter 440*b* are provided between a transmission node 460*b* and a duplexer 420*b*. The duplexer 420*b* is connected to the second unbalanced input node In20 of the filter 1000 via an amplifier 450*b*. Due to the presence of the duplexer 420*b*, a signal transmitted via the transmission node 460*b* is not sent to the second unbalanced input node In20 but is sent to the antenna 400 via the switch 410. The switch 410 selects one of the duplexers 420*a* and 420*b*.

Figure 3A:
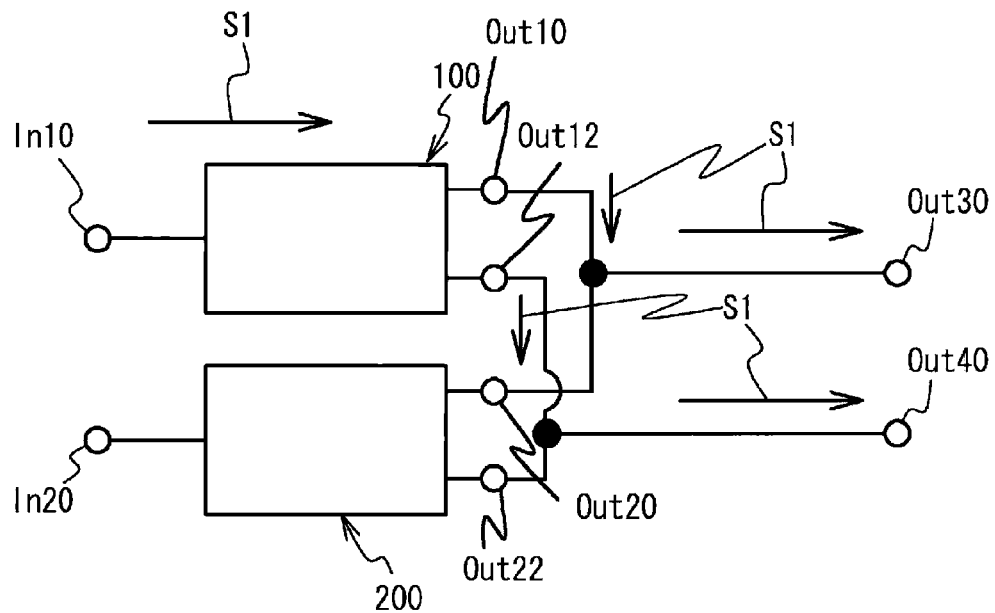
FIG. 3A schematically depicts a case where a signal of a frequency that falls within the pass band of a first acoustic wave filter is input, and FIG. 3B schematically depicts another case where a signal of a frequency that falls within the pass band of a second acoustic wave filter is input.

A case will now be considered where a signal S1 of frequency F1 included in the pass band of the first acoustic wave filter 100 is received via the antenna 400. The signal S1 received via the antenna 400 is sent to the duplexer 420*a* via the switch 410, and is input to the first unbalanced input node In10 via the amplifier 450*a*. FIG. 3A schematically illustrates a case where the signal S1 is applied to the acoustic wave filter 1000. As depicted in FIG. 3A, the signal S1 applied to the first unbalanced input node In10 passes through the first acoustic wave filter 100, and is output from the balanced output nodes Out30 and Out40 via the first balanced output nodes Out10 and Out 12.

Figure 3B:
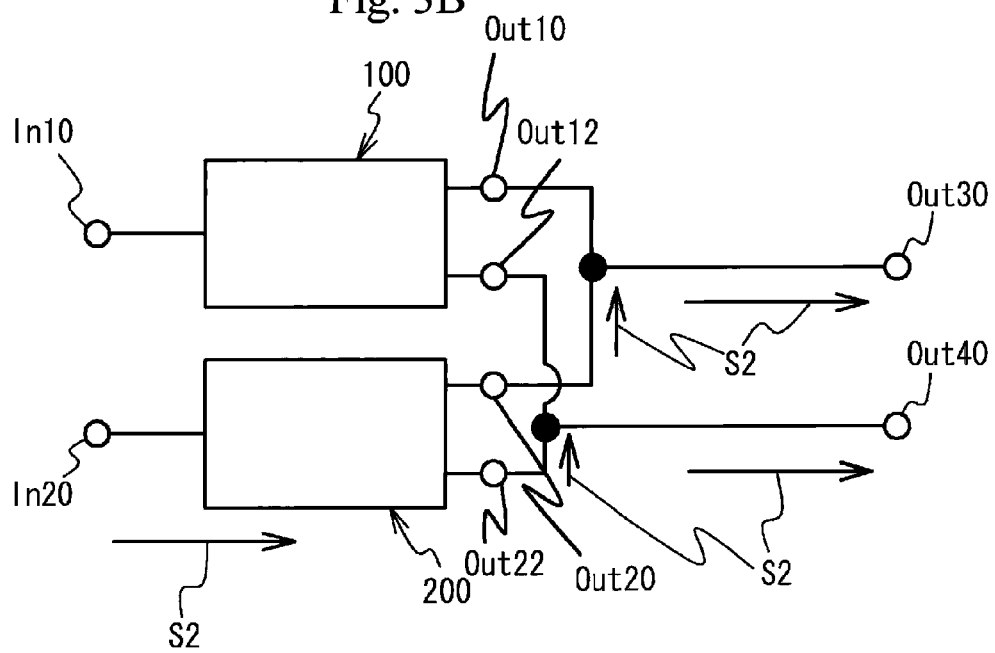

A case will now be considered where a signal S2 of frequency F2 included in the pass band of the second acoustic wave filter 200 is received via the antenna 400. The signal S2 received via the antenna 400 is sent to the duplexer 420*b* via the switch 410, and is input to the second unbalanced input node In20 via the amplifier 450*b*. FIG. 3B schematically illustrates a case where the signal S2 is applied to the acoustic wave filter 1000. As depicted in FIG. 3B, the signal S2 applied to the second unbalanced input node In20 passes through the second acoustic wave filter 200, and is output from the balanced output nodes Out30 and Out40 via the second balanced output nodes Out20 and Out22.

The first balanced output node Out10 and the second balanced output node Out20 are unified, and the first balanced output node Out12 and the second balanced output node Out22 are unified. Thus, the signal S1 (see FIG. 3A) that has passed through the first acoustic wave filter 100 leaks to the second acoustic wave filter 200. The signal S2 (see FIG. 3B) that has passed through the second acoustic wave filter 200 leaks to the first acoustic wave filter 100. The phenomena increase the insertion loses to the signals S1 and S2.

Referring to FIG. 1, the aperture length of the first multimode filter 10 is equal to that of the first multimode filter 12 and is assumed as L1. The aperture length of the second multimode filter 20 is equal to that of the second multimode filter 22 and is assumed as L2. By adjusting the aperture lengths L1 and L2, it is possible to adjust the impedances of the first and second multimode filters 10 and 20 and to adjust the impedances of the first and second multimode filters 12 and 22. That is, the aperture lengths L1 and L2 can be adjusted so that the second acoustic wave filter 200 is in the high-impedance state in the pass band of the first acoustic wave filter 100, and the first acoustic wave filter 100 is in the high-impedance state in the pass band of the second acoustic wave filter 200. It is thus possible to output the signals having reduced insertion losses.

As has been described previously, the first multimode filters 10 and 12 have the equal aperture lengths. This makes the impedances of the filters 10 and 12 approximately equal to each other. The multimode filters 14 and 16 have the equal aperture lengths. This makes the impedances of the filters 14 and 16 approximately equal to each other. Similarly, the aperture lengths of the second multimode filters 20 and 22 are equal to each other, so that the filters 20 and 22 have approximately equal impedances. The multimode filters 24 and 26 have equal aperture lengths, and have approximately equal impedances.

It is to be noted that the impedances of the multimode filters at the balanced output terminal sides (for example, Out10 and Out12) of one of the acoustic wave filters (for example, the first acoustic wave filter 100) acts as a capacitance for the other acoustic wave filter (for example, the second acoustic wave filter 200). Thus, when the multimode filters have the identical impedances, it is possible to prevent the balance characteristic of the other acoustic wave filter from being degraded. It is thus possible to reduce the differences in amplitude (degree of amplitude balance) and phase (degree of phase balance) between the signals output to the first balanced output nodes Out10 and Out12 and to reduce the differences in amplitude and phase between the signals output to the second balanced output nodes Out20 and Out22. As a result, it is possible to maintain the amplitude balance characteristic and the phase balance characteristic of the signals output from the first acoustic wave filter 100 and to maintain the amplitude balance characteristic and the phase balance characteristic of the signals from the second acoustic wave filter 200. The degree of phase balance is defined as a deviation in the phase difference between the signals from 180 degrees. That is, the phase difference is 180 degrees when the degree of phase balance is zero. The aperture length is the length of a section in which the interleaving upper and lower electrode fingers of IDT laterally overlap each other.

According to the first embodiment, signals having low insertion loss can be obtained by adjusting the aperture lengths L1 and L2. There is no need to use the series resonator. Thus, the acoustic wave device can be downsized, and no insertion loss caused by the series resonator is present. It is still possible to maintain the amplitude balance characteristic and phase balance characteristic of the signals respectively output from the balanced output nodes Out30 and Out40.

The balanced output nodes Out10 and Out20 are unified, and the balanced output nodes Out12 and Out22 are unified. It is thus possible to reduce the number of nodes on the output side from 4 to 2 and reduce the size of the acoustic wave device.

In the above-mentioned first embodiment, each of the first and second acoustic wave filters 100 and 200 has four multimode filters. The number of multimode filters is not limited to 4 but each of the filters 100 and 200 may have an arbitrary number of multiple multimode filters.

A description will now be given of results of computer simulation of the frequency characteristic, amplitude balance characteristic and the phase balance characteristic of the acoustic wave filters in accordance with the first embodiment.

First, a comparative example will be described. In the comparative example, the aperture length L1 of the first multimode filter is optimized so that the signals have low insertion loss while the amplitude balance characteristic and the phase balance characteristic can be maintained in a state in which the balanced output nodes Out10 and Out20 are not unified and the balanced output nodes Out12 and Out22 are not unified. Similarly, the aperture length L2 of the second multimode filter is optimized. After that, the balanced output nodes Out10 and Out20 are unified, and the balanced output nodes Out12 and Out22 are unified, so that the comparative example can be configured. In contrast, in the first embodiment, the aperture lengths L1 and L2 are optimized so that the second acoustic wave filter 200 is in the high-impedance state in the pass band of the first acoustic wave filter 100 and the first acoustic filter 100 is in the high-impedance state in the pass band of the second acoustic wave filter 200.

Figure 4:
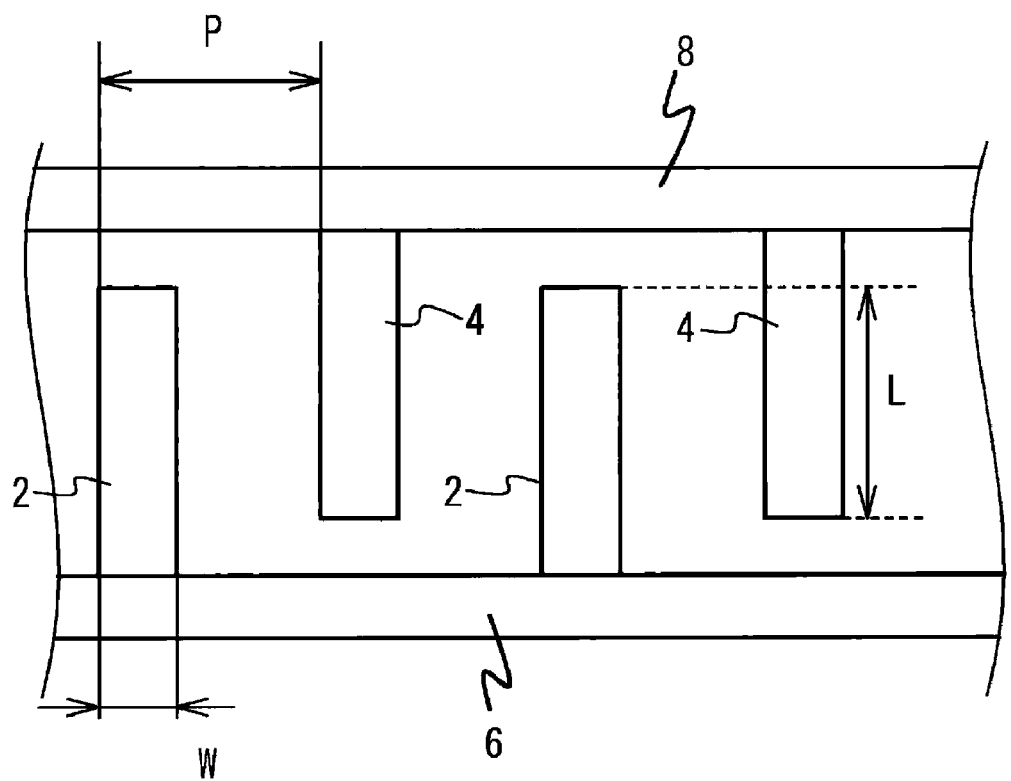
FIG. 4 illustrates definitions of parameters used in computer simulation.

FIG. 4 schematically depicts definitions of parameters used in the computer simulation. As depicted in FIG. 4, electrode fingers 2 are provided to a bus bar 6 on the lower side of IDT, and electrode fingers 4 are provided to a bus bar 8 on the upper side thereof. The aperture length L is the length of a section in which the electrode fingers 2 and 4 laterally overlap with each other. In the first multimode filters 10 and 12, L is equal to L1. In the second multimode filters 20 and 22, L is equal to L2. A symbol λ is the wavelength of acoustic waves propagated through the piezoelectric substrate. A symbol W denotes the width of the electrode fingers 2 and 4, and P is the electrode pitch. A symbol h is the thickness of the electrode fingers 2 and 4.

Table 1 describes parameters of the first multimode filters 10 and 12 used in computer simulation. In the comparative example, the aperture length of the first multimode filter 10 differs from that of the first multimode filter 12. In contrast, the first embodiment employs the identical aperture lengths of the multimode filters 10 and 12.

TABLE 1

| | FIRST ACOUSTIC WAVE FILTER 100 | | | |
| --- | --- | --- | --- | --- |
| | COMPARATIVE EXAMPLE | | 1ST EMBODIMENT | |
| | 1st multimode filter 10 | 1st multimode filter 12 | 1st multimode filter 10 | 1st multimode filter 12 |
| aperture length | 48.4λ | 38.7λ | 21.5λ | 21.5λ |
| numbers of electrode fingers | 12/40/20 | 12/40/20 | 12/40/20 | 12/40/20 |
| wavelength λ | 2.16 μm | 2.16 μm | 2.16 μm | 2.16 μm |
| W/P | 0.61 | 0.61 | 0.61 | 0.61 |
| film thickness h of electrode fingers | 0.088λ | 0.088λ | 0.088λ | 0.088λ |

Table 2 describes parameters of the second multimode filters 20 and 22. In the comparative example, the aperture length of the second multimode filter 20 differs from that of the second multimode filter 22. In contrast, the first embodiment employs the identical aperture lengths of the multimode filters 20 and 22.

TABLE 2

| | FIRST ACOUSTIC WAVE FILTER 200 | | | |
| --- | --- | --- | --- | --- |
| | COMPARATIVE EXAMPLE | | 1ST EMBODIMENT | |
| | 2nd multimode filter 20 | 2nd multimode filter 22 | 2nd multimode filter 20 | 2nd multimode filter 22 |
| aperture length | 47.6λ | 40.3λ | 25.5λ | 25.5λ |
| numbers of electrode fingers | 26/24/36 | 26/24/36 | 26/24/36 | 26/24/36 |
| wavelength λ | 2.02 μm | 2.02 μm | 2.02 μm | 2.02 μm |
| W/P | 0.61 | 0.61 | 0.61 | 0.61 |
| film thickness h of electrode fingers | 0.094λ | 0.094λ | 0.094λ | 0.094λ |

Table 3 describes parameters of the multimode filters 14 and 16. Table 4 describes parameters of the multimode filters 24 and 26. In Tables 3 and 4, there is no difference between the comparative example and the first embodiment.

TABLE 3

FIRST ACOUSTIC WAVE FILTER 100

| | COMPARATIVE EXAMPLE | | 1ST EMBODIMENT | |
|---|---|---|---|---|
| | multimode filter 14 | multimode filter 16 | multimode filter 14 | multimode filter 16 |
| aperture length | 21.5λ | 21.5λ | 21.5λ | 21.5λ |
| numbers of electrode fingers | 26/40/36 | 26/40/36 | 26/40/36 | 26/40/36 |
| wavelength λ | 2.16 µm | 2.16 µm | 2.16 µm | 2.16 µm |
| W/P | 0.61 | 0.61 | 0.61 | 0.61 |
| film thickness h of electrode fingers | 0.088λ | 0.088λ | 0.088λ | 0.088λ |

TABLE 4

FIRST ACOUSTIC WAVE FILTER 200

| | COMPARATIVE EXAMPLE | | 1ST EMBODIMENT | |
|---|---|---|---|---|
| | multimode filter 24 | multimode filter 26 | multimode filter 24 | multimode filter 26 |
| aperture length | 25.5λ | 25.5λ | 25.5λ | 25.5λ |
| numbers of electrode fingers | 12/24/20 | 12/24/20 | 12/24/20 | 12/24/20 |
| wavelength λ | 2.02 µm | 2.02 µm | 2.02 µm | 2.02 µm |
| W/P | 0.61 | 0.61 | 0.61 | 0.61 |
| film thickness h of electrode fingers | 0.094λ | 0.094λ | 0.094λ | 0.094λ |

The number of electrode fingers is now described. The numbers of electrode fingers in tables such as 12/40/20 of the first multimode filter 10 described in Table 1 indicate that the numbers of electrode fingers of IDT 10a, IDT 10b and IDT 10a arranged in the left-to-right direction in FIG. 1 are 12, 40 and 20, respectively. The other multimode filters are described similarly.

FIGS. 5A through 8B describe results of computer simulation in accordance with the first embodiment. In these graphs a dotted line denotes the comparative example, and a solid line denotes the first embodiment.

Figure 5A:
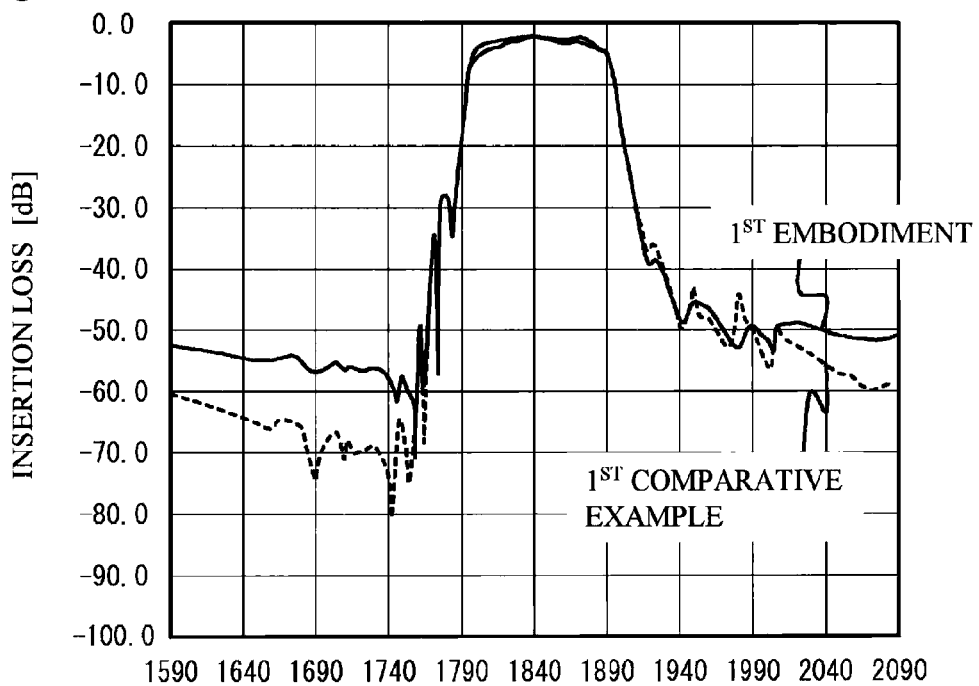
FIG. 5A is a graph of the results of computer simulation of the frequency characteristic of the first acoustic wave filter.
Figure 5B:
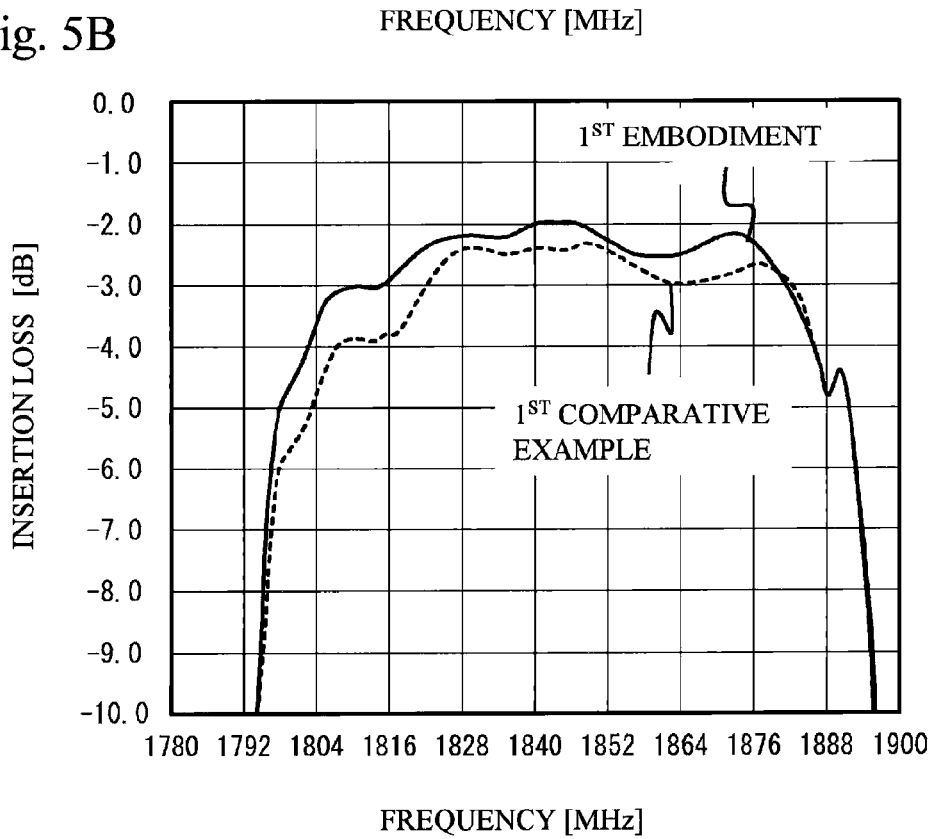
FIG. 5B is an enlarged view in the pass band of the first acoustic wave filter.

FIG. 5A is a graph of the results of computer simulation of the frequency characteristics of the first acoustic wave filter 100. FIG. 5B is an enlarged view of the pass band of the filter 100 depicted in FIG. 5A. The horizontal axes denote the frequency, and the vertical axes denote insertion loss. As depicted in FIG. 5B, the insertion loss of the first embodiment is 1 dB less than the comparative example at maximum in the pass band.

Figure 6A:
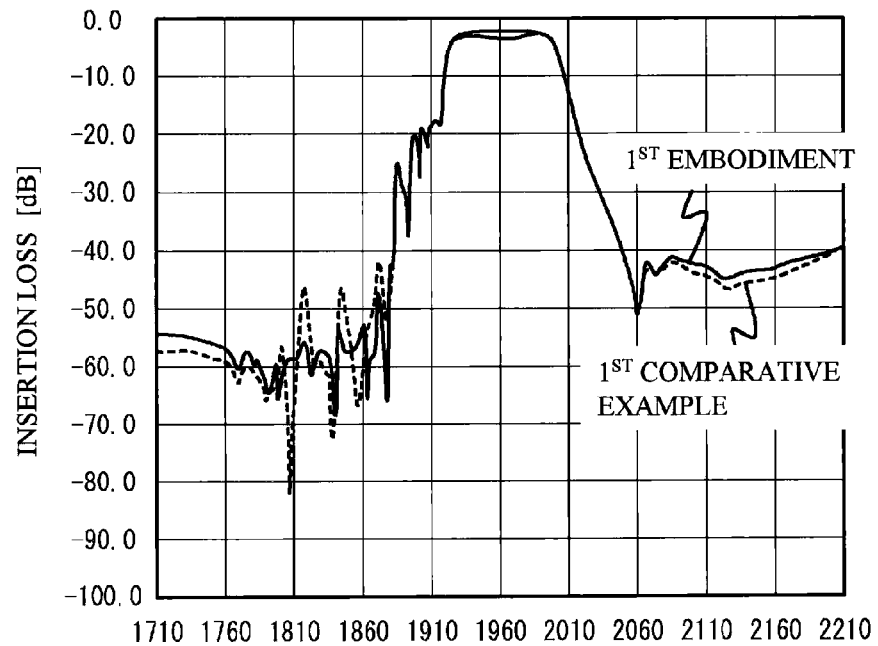
FIG. 6A is a graph of the results of computer simulation of the frequency characteristic of a second acoustic wave filter.
Figure 6B:
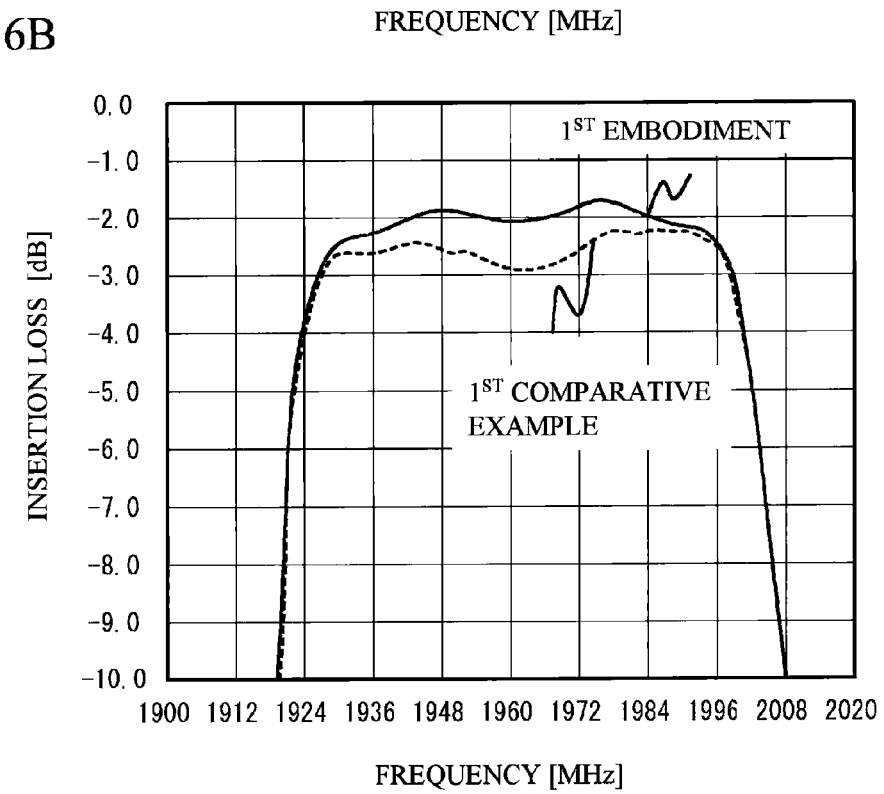
FIG. 6B is an enlarged view in the pass band of the second acoustic wave filter.

FIG. 6A is a graph of the results of computer simulation of the frequency characteristics of the second acoustic wave filter 200. FIG. 6B is an enlarged view of the pass band of the second acoustic wave filter 200. As depicted in FIG. 6B, the insertion loss of the first embodiment is 1 dB less than the comparative example at maximum in the pass band.

In the comparative example, the aperture lengths L1 and L2 are not optimized in the configuration in which the first balanced output node Out10 and the second balanced output node Out20 are unified and the first balanced output node Out12 and the second balanced output node Out22 are unified. Thus, signal leakage takes place and insertion loss is increased. In contrast, in the first embodiment, the aperture lengths L1 and L2 are optimized. Thus, the second acoustic wave filter 200 is in the high-impedance state in the pass band in the first acoustic wave filter 100, and the first acoustic wave filter 100 is in the high-impedance state in the pass band of the second acoustic wave filter 200. It is thus possible to suppress the signal leakage and reduce the insertion loss. As a result, the first embodiment is capable of realizing filtered signals with reduced insertion loss, as illustrated in FIGS. 5A through 6B.

Figure 7A:
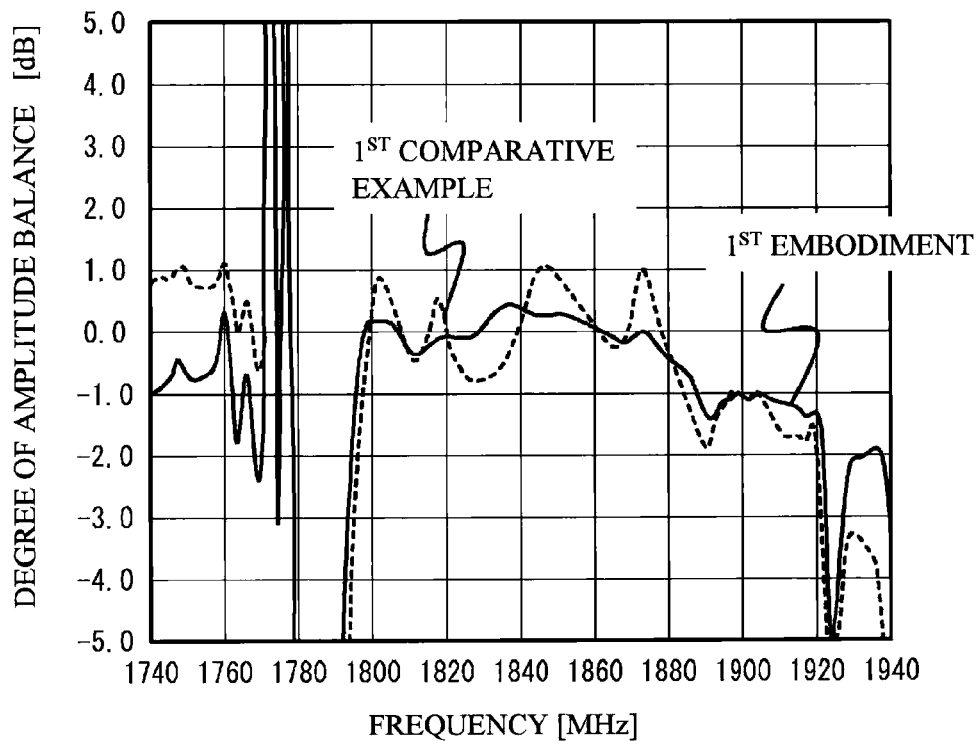
FIG. 7A is a graph of the results of computer simulation of an amplitude balance characteristic of the first acoustic wave filter.

FIG. 7A is a graph of the results of computer simulation of the amplitude balance characteristic of the first acoustic wave filter 100. The horizontal axis of the graph denotes the frequency, and the vertical axis denotes the degree of amplitude balance between the signal output from the first balanced output node Out10 and the signal output from the first balanced output node Out12. The first embodiment indicated by a solid line has less variation than the comparative example indicated by a broken line and has improved amplitude balance characteristic.

Figure 7B:
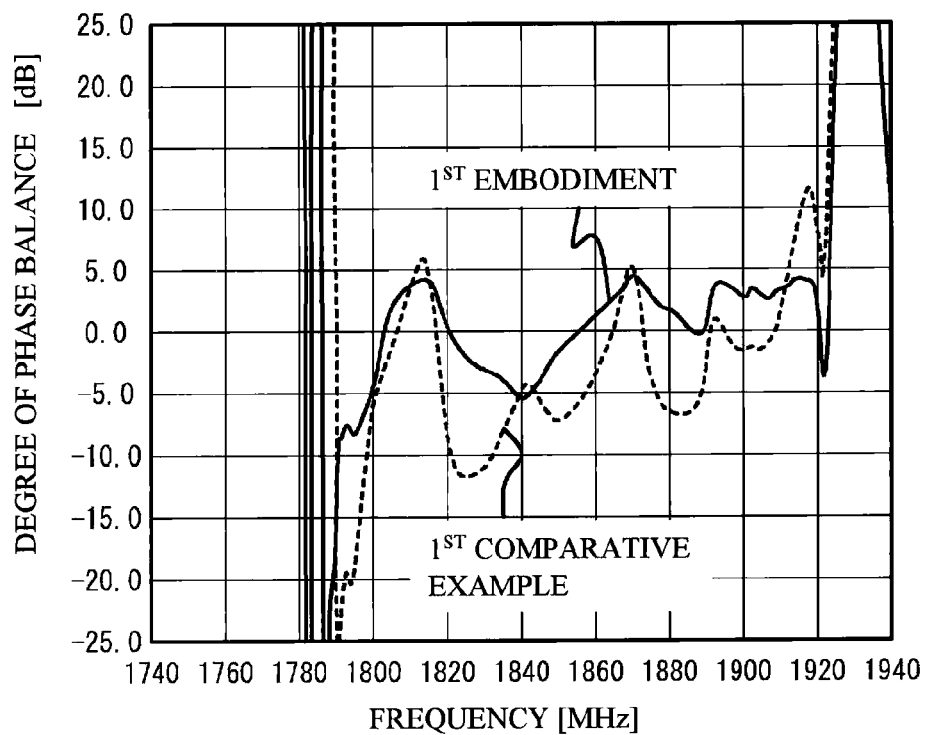
FIG. 7B is a graph of the results of computer simulation of a phase balance characteristic thereof.

FIG. 7B is a graph of the results of computer simulation of the phase balance characteristic of the first acoustic wave filter 100. The horizontal axis of the graph denotes the frequency, and the vertical axis denotes the degree of phase balance between the signal output from the first balanced output node Out10 and the signal output from the first balanced output node Out12. As has been described previously, when the degree of phase balance is zero, there is a 180-degree phase difference between the signal output from the first balanced output node Out10 and the signal output from the first balanced output node Out12. The first embodiment has an improved phase balance characteristic than the comparative example.

Figure 8A:
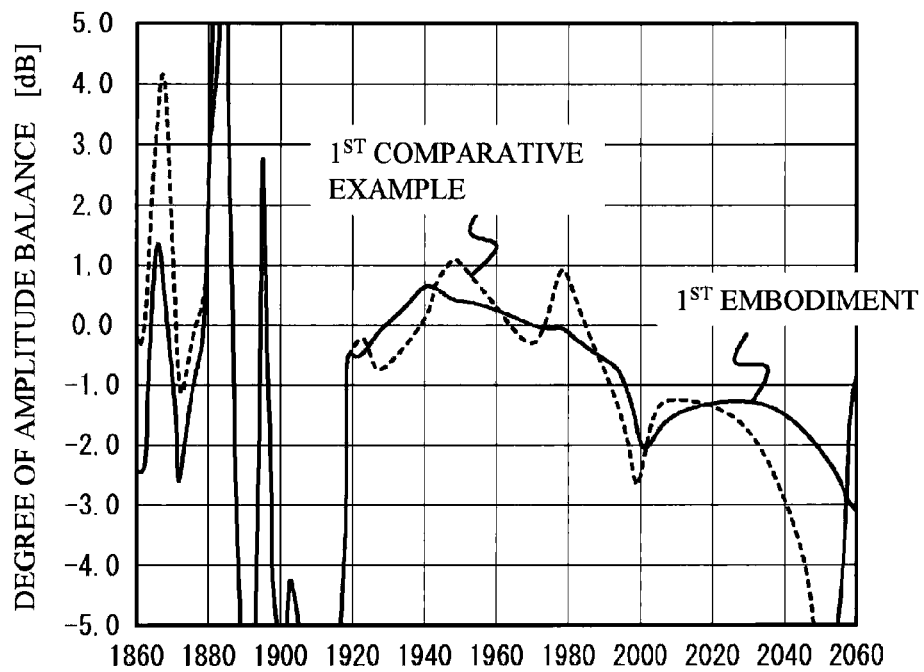
FIG. 8A is a graph of the results of computer simulation of an amplitude balance characteristic of the second acoustic wave filter.

FIG. 8A is a graph of the results of computer simulation of the amplitude balance characteristic of the second acoustic wave filter 200. The graph depicts the degree of amplitude balance between the signal output from the second balanced output node Out20 and the signal output from the second balanced output node Out22. The first embodiment has an improved amplitude balance characteristic than the comparative example.

Figure 8B:
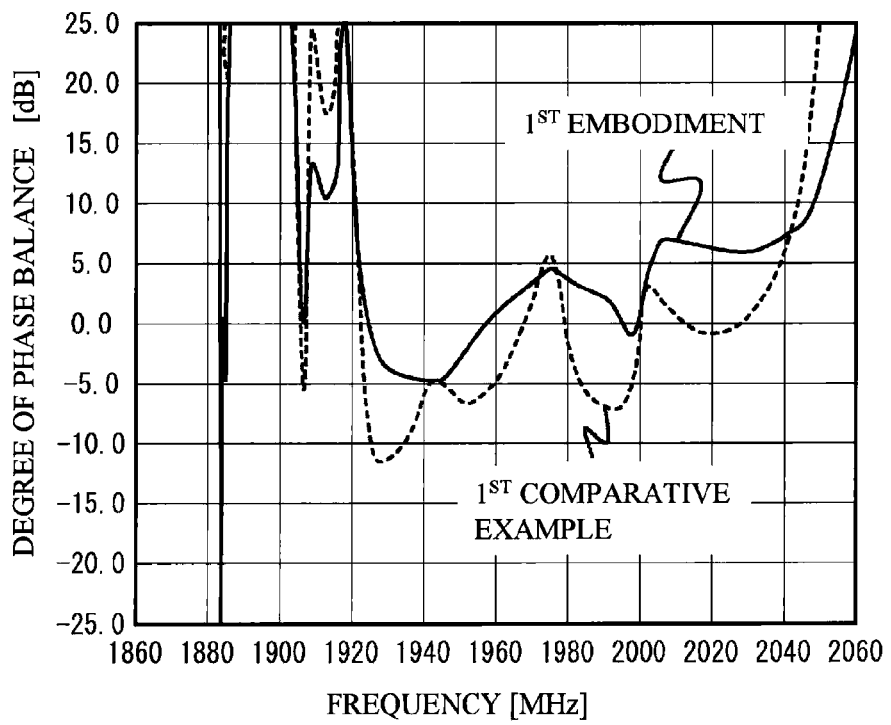
FIG. 8B is a graph of the results of computer simulation of a phase balance characteristic thereof.

FIG. 8B is a graph of the results of computer simulation of the phase balance characteristic of the second acoustic wave filter 200. The graph depicts the degree of phase balance between the signal output from the second balanced output node Out20 and the signal output from the second balanced output node Out22. The first embodiment has an improved phase balance characteristic than the comparative example.

As has been described with reference to FIGS. 7A through 8B, the first embodiment is capable of improving the amplitude balance characteristic and the phase balance characteristic.

Second Embodiment

Figure 9:
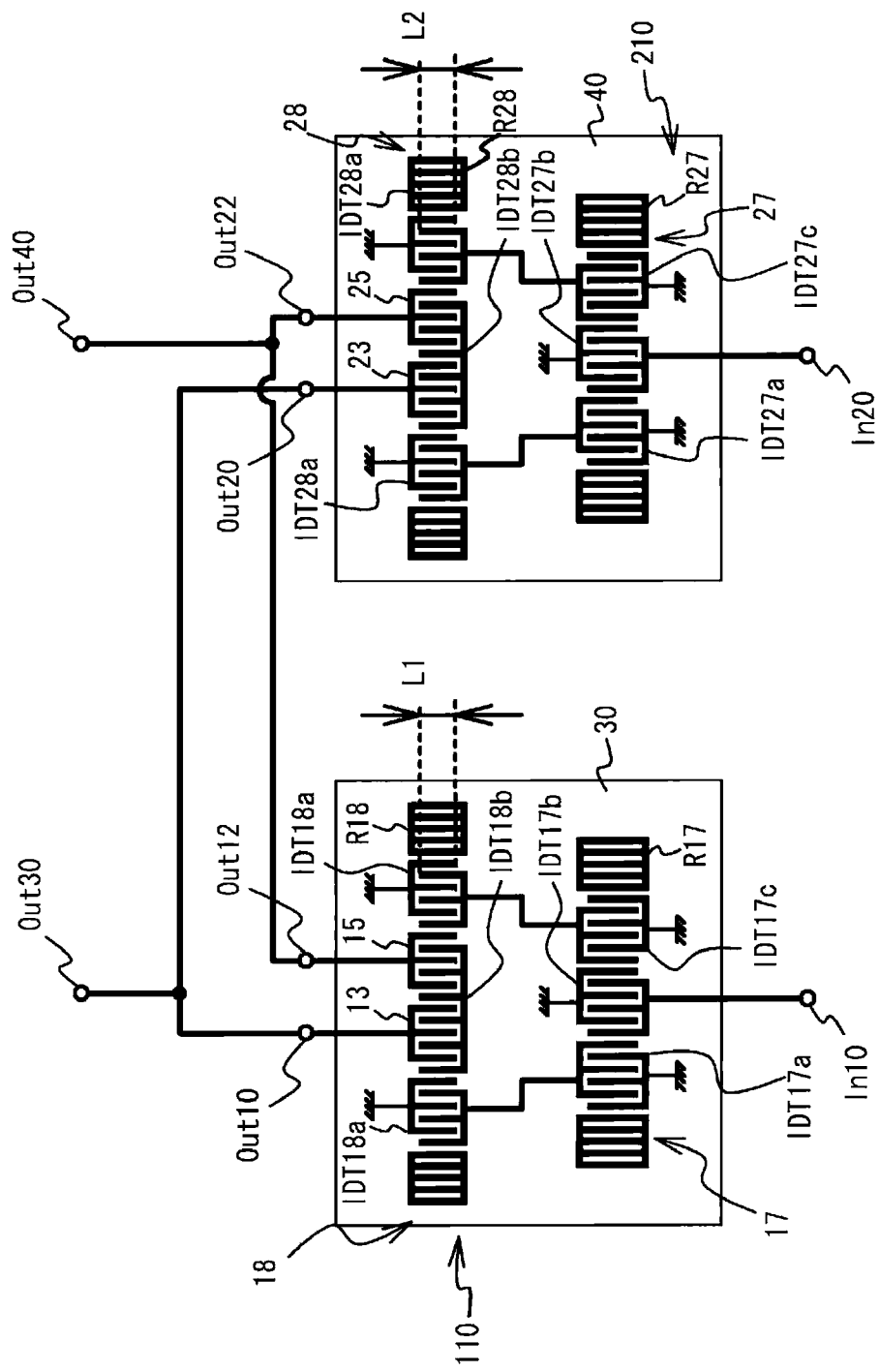
FIG. 9 is a plan view of an acoustic wave filter in accordance with a second embodiment.

A second embodiment has an exemplary structure in which the output IDT of the first multimode filter has two divided bus bars, and the output IDT of the second multimode filter has two divided bus bars. FIG. 9 is a plan view of a surface acoustic wave filter in accordance with the second embodiment.

A first acoustic wave filter 110 is described with reference to FIG. 9. A multimode filter 17 is connected to the first unbalanced input node In10. A first multimode filter 18 is connected in series to the multimode filter 17. An output IDT 18b provided in the center of the first multimode filter 18 has two divided bus bars 13 and 15, which are connected to the first balanced output nodes Out10 and Out12, respectively.

Two input IDTs 18a are arranged at the outsides of the output IDT 18b, and reflectors R18 are disposed outside of the input IDTs 18a. In the multimode filter 17, output IDTs 17a and 17c are arranged at both sides of the input IDT 17b, and reflectors R17 are arranged further out than the output IDTs 17a and 17c. The output IDTs 17a and 17c are connected to the two input IDTs 18a, respectively. The electrode fingers of the multimode filter 17 are arranged so that there is a 180-degree phase difference between the signal output from the output IDT 17a and the signal output from the output IDT 17c. Thus, signals that are 180 degrees out of phase are available between the first balanced output nodes Out10 and Out12.

A second acoustic wave filter 210 has a configuration similar to that of the first acoustic wave filter 110, and an output IDT 28b provided in the center of the second multimode filter 28 has two divided bus bars 23 and 25. The bus bars 23 and 25 provided in the output IDT 28b are connected to the second balanced output nodes Out20 and Out22, respectively. The electrode fingers of the multimode filter 27 are arranged so that the signals respectively output from output IDTs 27a and 27c have a 180-degree phase difference. Thus, the signals that are 180 degrees out of phase are available through the second balanced output nodes Out20 and Out22.

Like the first embodiment, the first balanced output node Out10 and the second balanced output node Out20 are unified, and the first balanced output node Out12 and the second balanced output node Out22 are unified. Thus, the impedance adjustment of the first acoustic wave filter 110 and the second acoustic wave filter 210 can easily be achieved by adjusting the aperture length L1 of the first multimode filter 18 and the aperture length L2 of the second multimode filter 28.

According to the second embodiment, the first acoustic wave filter 110 is composed of the first multimode filter 18 and the multimode filter 17. The second acoustic wave filter 210 is composed of the second multimode filter 28 and the multimode filter 27. As compared to the first embodiment, the acoustic wave filter can be formed by a reduced number of multimode filters, so that downsizing of filter can be realized.

Third Embodiment

Figure 10:
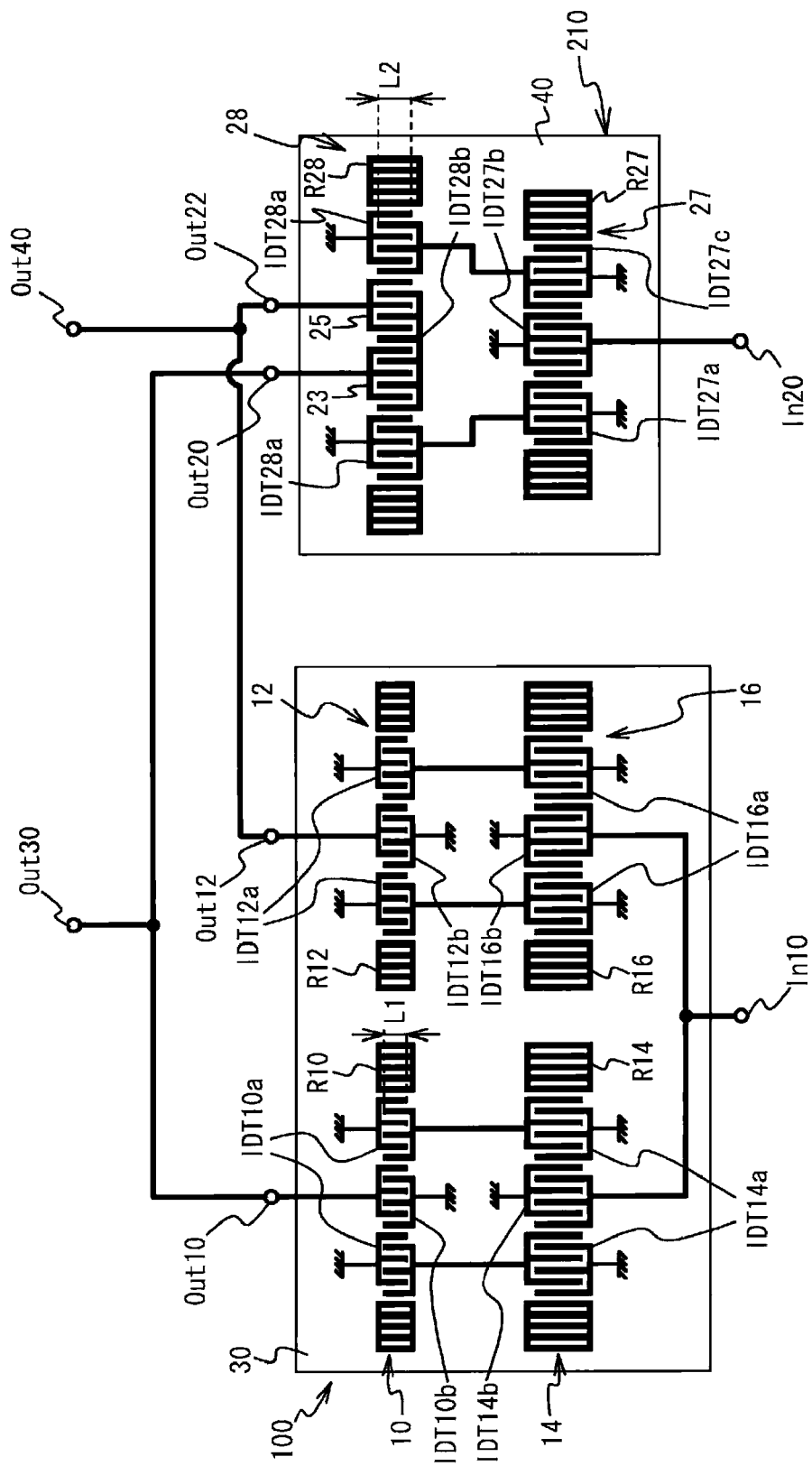
FIG. 10 is a plan view of an acoustic wave filter in accordance with a third embodiment.

A third embodiment has an exemplary configuration realized by the combination of the first acoustic wave filter 100 of the first embodiment and the second acoustic wave filter 210 of the second embodiment. FIG. 10 is a plan view of an acoustic wave filter in accordance with the third embodiment.

The first multimode filter 10 is connected to the first balanced output node Out10, and the first multimode filter 12 is connected to the first balanced output node Out12. The output IDT 28b of the second multimode filter 28 has two divided bus bars 23 and 25. The second balanced output nodes Out20 and Out22 are connected to the bus bars 23 and 25, respectively. The first balanced output node Out10 and the second balanced output node Out20 are unified, and the first balanced output node Out12 and the second balanced output node Out22 are unified. Like the first embodiment, the impedance adjustment of the first acoustic wave filter 100 and the second acoustic wave filter 210 can easily be achieved by adjusting the aperture length L1 of the first multimode filter 12 and the aperture length L2 of the second multimode filter 28.

According to the third embodiment, it is possible to reduce the number of multimode filters that form the second acoustic wave filter and reduce the filter size.

The above-mentioned third embodiment has the combination of the first acoustic wave filter 100 and the second acoustic wave filter 210. Similar effects can be obtained by the combination of the first acoustic wave filter 110 of the second embodiment and the second acoustic wave filter 200 of the first embodiment.

As has been described in connection with the second and third embodiments, downsizing of filter can be achieved when at least one of the first and second multimode filters has two divided bus bars and these bus bars are respectively connected to the first balanced output nodes Out10 and Out12 or the second balanced output nodes Out20 and Out22.

As depicted in FIG. 1, the first embodiment has the exemplary configuration in which each of the first and second acoustic wave filters is equipped with two multimode filters connected to the unbalanced input node in parallel. In contrast, as depicted in FIG. 10, the third embodiment is configured so that either the first acoustic wave filter of the second acoustic wave filter is equipped with two balanced multimode filters connected to the unbalanced input node in parallel. According to an aspect of the present invention, at least one of the first and second acoustic wave filters has two multimode filters connected to the unbalanced input node in parallel.

Fourth Embodiment

Figure 11:
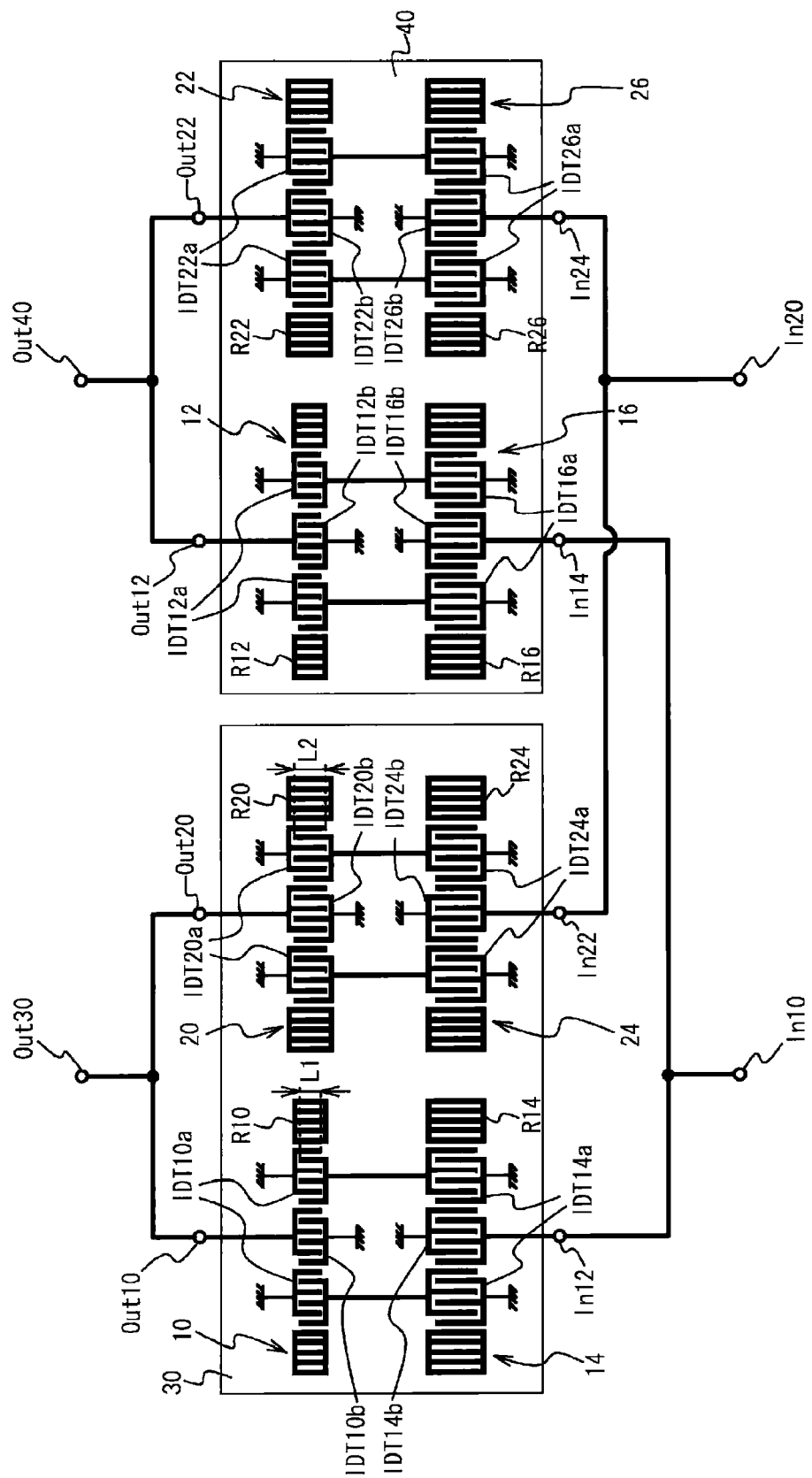
FIG. 11 is a plan view of an acoustic wave filter in accordance with a fourth embodiment.

A fourth embodiment has an exemplary configuration in which the first multimode filter 12 and the multimode filter 16 of the first embodiment are replaced with the second multimode filter 20 and the multimode filter 24, respectively. FIG. 11 is a plan view of an acoustic wave filter according to the fourth embodiment.

As depicted in FIG. 11, the multimode filter 14, the multimode filter 24, the first multimode filter 10 and the second multimode filter 20 are formed on a piezoelectric substrate 30, and the multimode filter 16, the multimode filter 26, the first multimode filter 12 and the second multimode filter 22 are formed on a piezoelectric substrate 40. An interconnection that connects the first unbalanced input nodes In12 and In14 crosses an interconnection that connects the second unbalanced input node In22 and the second unbalanced input node In24. In contrast, an interconnection that connects the first balanced output node Out10 and the second balanced output node Out20 does not cross an interconnection that connects the first balanced output node Out12 and the second balanced output node Out22.

According to the fourth embodiment, the interconnections on the output side do not cross each other, and thus the interference between the output signals hardly takes place. It is thus possible to improve the amplitude balance characteristic and the phase balance characteristic, as compared to the first embodiment.

Fifth Embodiment

Figure 12:
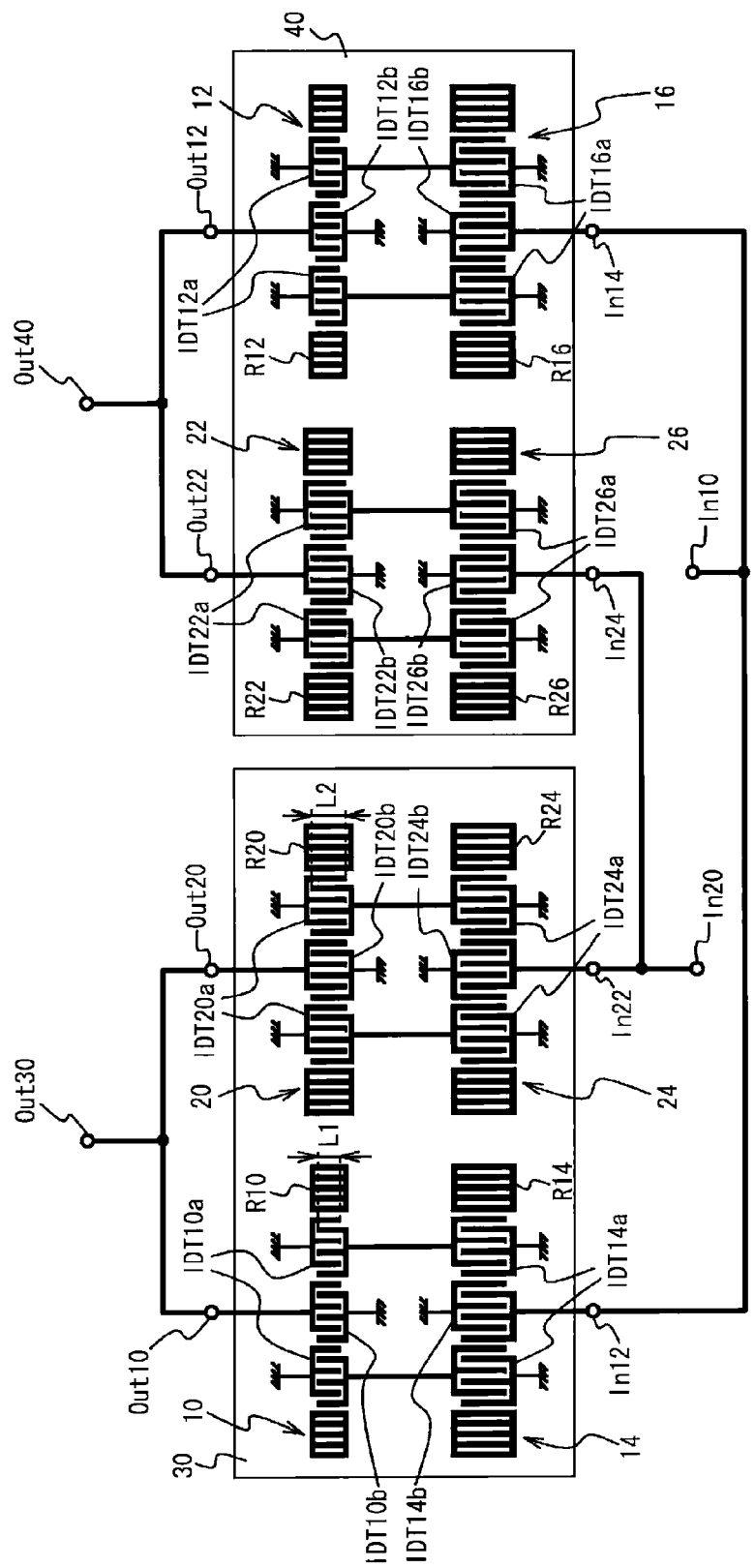
FIG. 12 is a plan view of an acoustic wave filter in accordance with a fifth embodiment.

A fifth embodiment has an exemplary configuration in which the first multimode filter 12 and the multimode filter 16 of the fourth embodiment are replaced with the second multimode filter 22 and the multimode filter 26, respectively. FIG. 12 is a plan view of an acoustic wave filter according to the fifth embodiment.

As depicted in FIG. 12, the multimode filter 14, the multimode filter 24, the first multimode filter 10 and the second multimode filter 20 are formed on the piezoelectric substrate 30, and the multimode filter 16, the multimode filter 26, the first multimode filter 12 and the second multimode filter 22 are formed on the piezoelectric substrate 40. Like the fourth embodiment, the interconnection that connects the first balanced output node Out10 and the second balanced output node Out20 does not cross the interconnection that connects the first balanced output node Out12 and the second balanced output node Out22. Further, an interconnection that connects the first unbalanced input node In12 and the first unbalanced input node In14 does not cross an interconnection that connects the second unbalanced input node In22 and the second unbalanced input node In24.

If the interconnections on the input side cross each other, a signal (for example, S2 previously described in connection with the first embodiment) in the pass band of one of the acoustic wave filters (for example, the second acoustic wave filter) may leak to the other acoustic wave filter (for example, the first acoustic wave filter) due to coupling between interconnections. Since the first and second acoustic wave filters have different pass bands, signal leakage may degrade the amount of attenuation of the other acoustic wave filter. According to the fifth embodiment, there is no crossing of the input-side interconnections, so that signal leakage due to coupling between interconnections and degradation of attenuation can be prevented.

Sixth Embodiment

Figure 13:
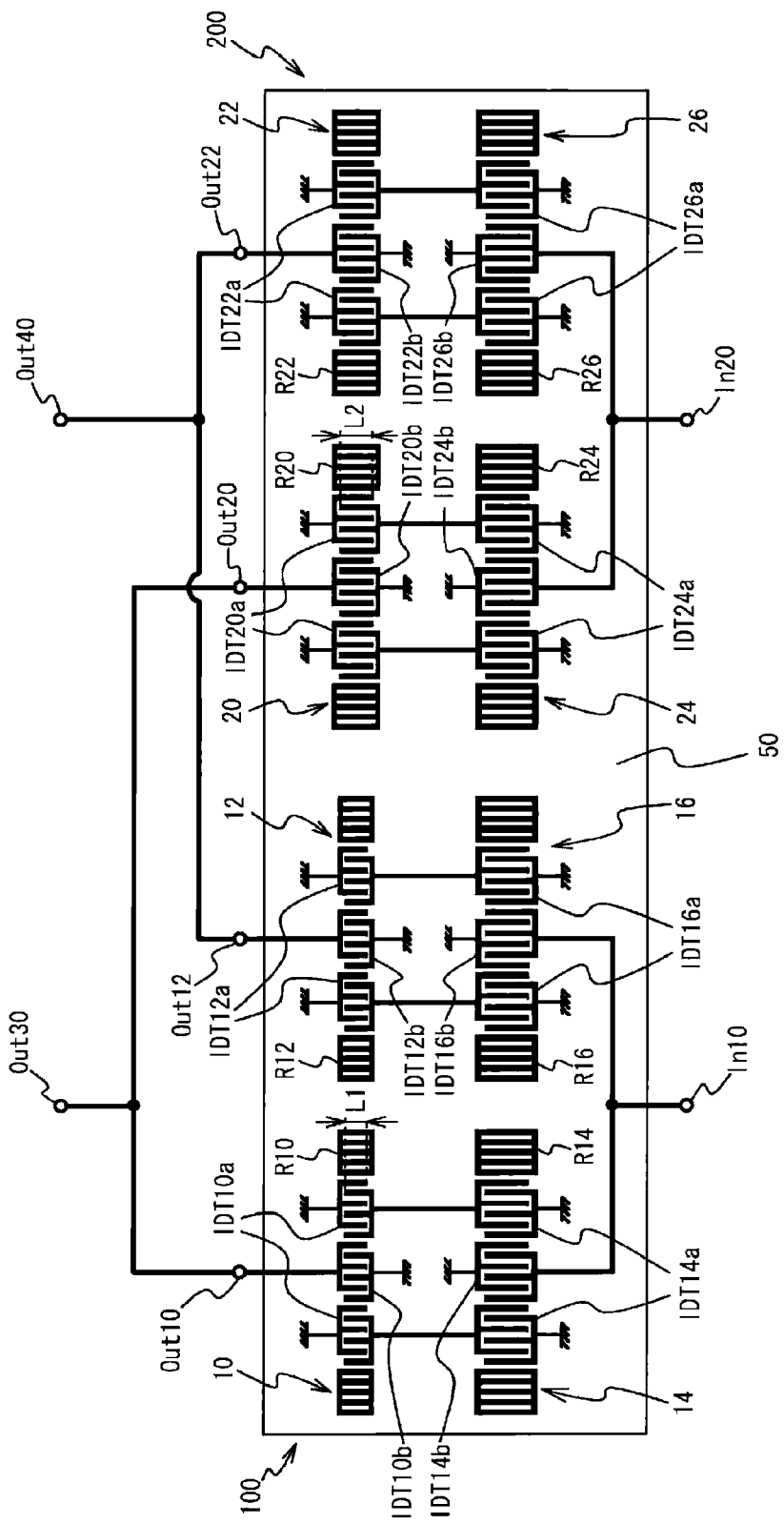
FIG. 13 is a plan view of an acoustic wave filter in accordance with a sixth embodiment.

A sixth embodiment has an exemplary configuration in which the first acoustic wave filter 100 and the second acoustic wave filter 200 are arranged on an identical or single piezoelectric substrate 50. FIG. 13 is a plan view of an acoustic wave filter in accordance with the sixth embodiment. The sixth embodiment realizes further downsizing can be achieved, as compared to the first embodiment.

Figure 14A:
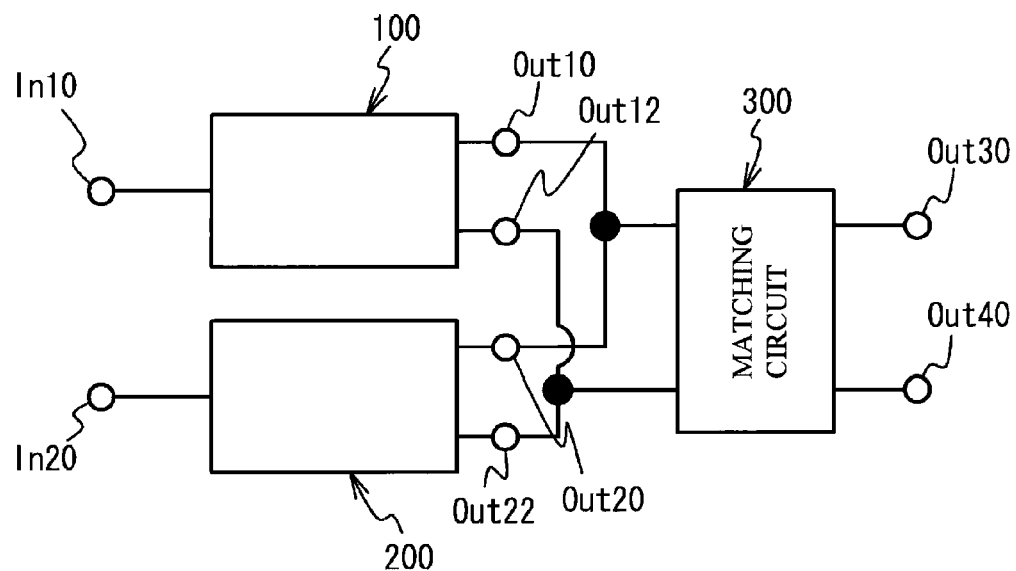
FIG. 14A is a block diagram of a configuration with a matching circuit.
Figure 14B:
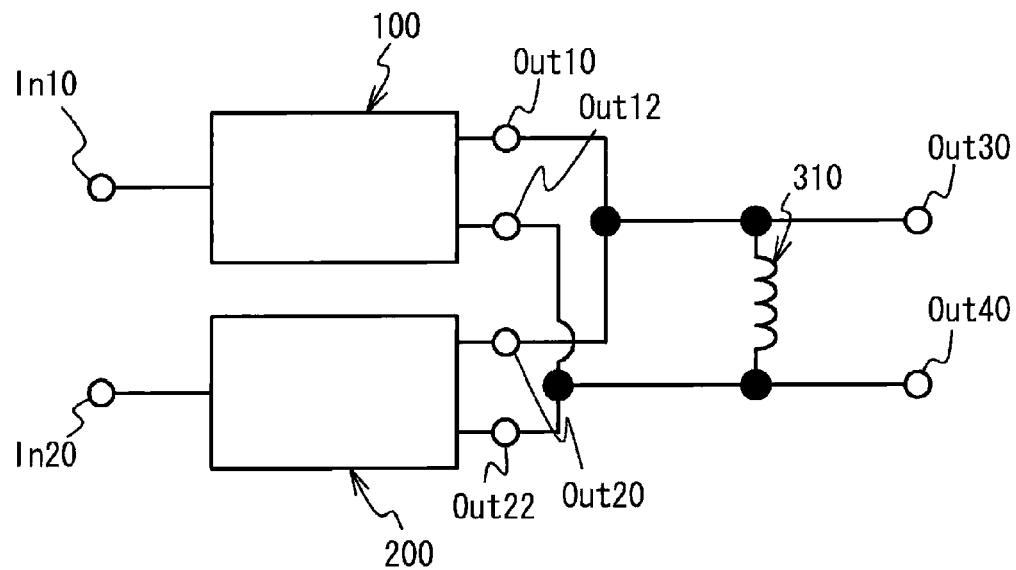
FIG. 14B shows a matching circuit composed of an inductor.

Since the balanced output terminals are unified, one of the first and second acoustic wave filters is seen as a capacitance from the other acoustic wave filter, and the impedance is capacitive. In order to compensate for impedance mismatch, as illustrated in FIG. 14a, a matching circuit 300 may be disposed between the balanced output nodes Out30 and Out40 in the first through sixth embodiments. Particularly, the capacitive impedance is adjusted by an inductor 310 of the matching circuit 300, as depicted in FIG. 14B.

Seventh Embodiment

Figure 15:
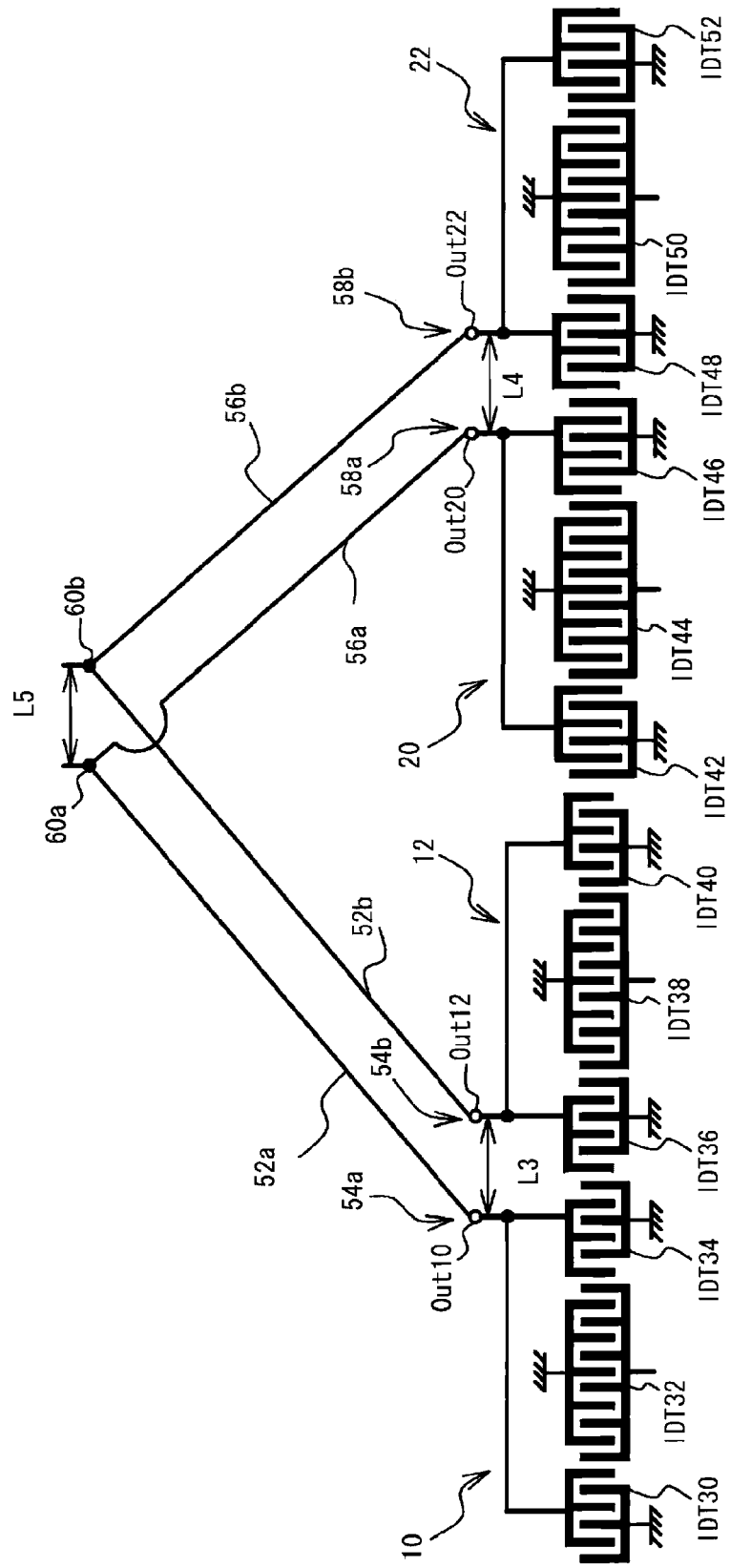
FIG. 15 is an enlarged view of an acoustic wave filter in accordance with a seventh embodiment.

A seventh embodiment has an exemplary configuration in which the distances between the interconnections respectively connected to the two first multimode filters are adjusted and the distances between the interconnections respectively connected to the two second multimode filters are adjusted. FIG. 15 is an enlarged view of a part related to two first multimode filters and two second multimode filters of an acoustic wave filter in accordance with the seventh embodiment. It is to be noted that the piezoelectric substrates 30 and 40 and reflectors R10, R12, R20 and R22 are not illustrated for the sake of simplicity.

As depicted in FIG. 15, the first multimode filter 10 is equipped with the output IDT 30, the input IDT 32 and the output IDT 34. The output IDTs 30 and 34 are connected to the first balanced output node Out10. The first multimode filter 12 is equipped with an output IDT 36, an input IDT 38 and an output IDT 40. The output IDT 36 and the output IDT 40 are connected to the first balanced output node Out12. The second multimode filter 20 is equipped with an output IDT 42, an input IDT 44 and an output IDT 46. The output IDT 42 and the output IDT 46 are connected to the second balanced output node Out20. The second multimode filter 22 is equipped with an output IDT 48, an input IDT 50 and an output IDT 52. The output IDT 48 and the output IDT 52 are connected to the second balanced output node Out22. The first multimode filters 10 and 12 have different aperture lengths from those of the second multimode filters 20 and 22. Thus, as has been described previously, it is possible to easily implement impedance adjustment.

The first balanced output node Out10 is connected to a first interconnection 52a at a first connecting point 54a, and the first balanced output node Out12 is connected to a first interconnection 52b at a first connecting point 54b. Similarly, the second balanced output nodes Out20 and Out22 are connected to second interconnections 56a and 56b at second connecting points 58a and 58b, respectively. The first interconnection 52a and the second interconnection 56a are connected to each other at a third connecting point 60a, and the first interconnection 52b and the second interconnection 56b are connected to each other at a third connecting point 60b. That is, the interconnections 52a and 56a are unified, and the interconnections 52b and 56b are unified. The first interconnections 52a and 52b have approximately equal lengths, and the second interconnections 56a and 56b are approximately equal in length.

In the example depicted in FIG. 15, L3, L4 and L5 are substantially equal to each other where L3 is the distance between the first connecting points 54a and 54b, L4 is the distance between the second connecting points 58a and 58b, and L5 is the distance between the third connecting points 60a and 60b. Thus, the first interconnections 52a and 52b are connected to the third connecting points 60a and 60b through routes having approximately equal lengths. It is thus possible to improve the amplitude balance characteristic and the phase balance characteristic of the signal output from the first balanced output node Out10 and that output from the balanced output node Out12. Similarly, the second interconnections 56a and 56b are connected to the third connecting points 60a and 60b through routes having approximately equal lengths. It is thus possible to improve the amplitude balance characteristic and the phase balance characteristic of the signal output from the second balanced output node Out20 and that output from the second balanced output node Out22.

Figure 16:
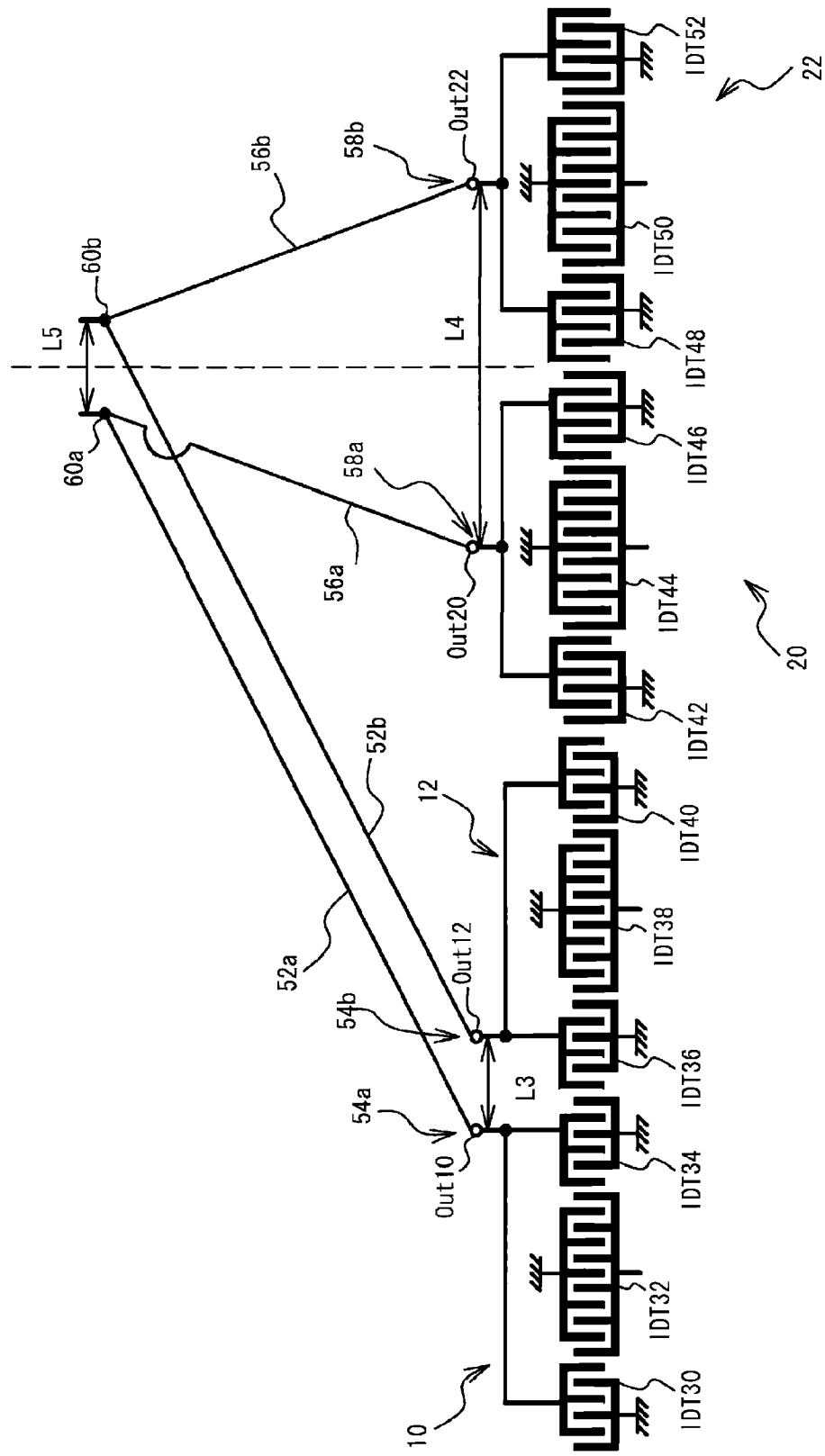
FIG. 16 is an enlarged view of a variation of the seventh embodiment.

FIG. 16 depicts a variation of the second embodiment. As illustrated in FIG. 16, the distance L3 between the first connecting points 54a and 54b is approximately equal to the distance L5 between the third connecting points 60a and 60b. Thus, the first interconnections 52a and 52b are respectively connected to the third connecting points 60a and 60b via routes having approximately equal lengths. As depicted by a broken line, a perpendicular bisector between the second connecting points 58a and 58b coincides with a perpendicular bisector between the third connecting points 60a and 60b. Thus, the second interconnections 56a and 56b are connected to the third connecting points 60a and 60b via routes having approximately equal lengths. It is thus possible to improve the amplitude balance characteristic and the phase balance characteristic of the acoustic wave filter. According to the configuration depicted in FIG. 16, the amplitude balance characteristic and the phase balance characteristic of the acoustic wave filter can be improved even if the distance L3 between the first connecting points 54a and 54b is not equal to the distance L4 between the second connecting points 58a and 58b.

Figure 17:
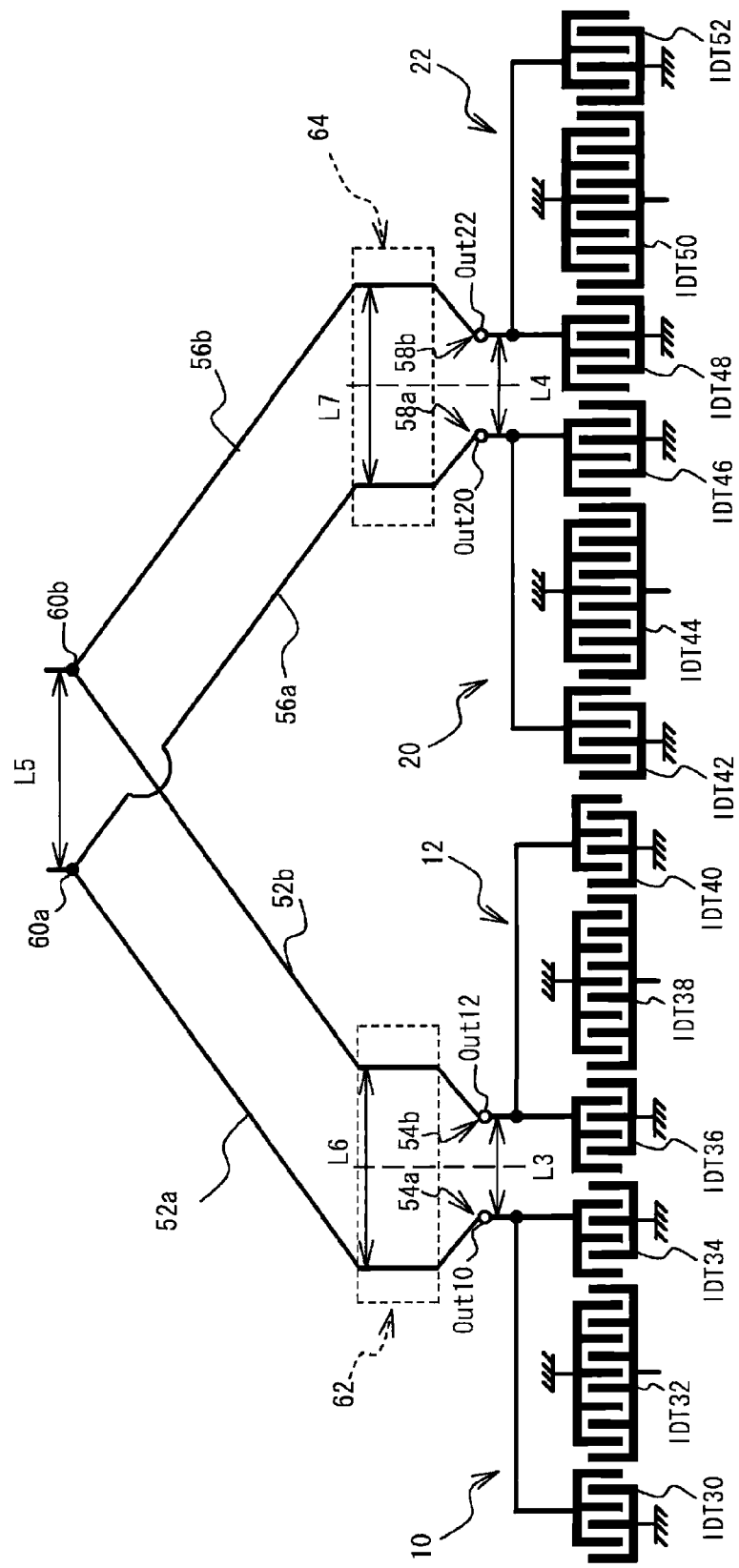
FIG. 17 is an enlarged view of another variation of the seventh embodiment.

FIG. 17 illustrates another variation of the seventh embodiment. As depicted in FIG. 17, the first interconnections 52a and 52b have a first region 62 (surrounded by a broken line) in which the greatest distance between the first interconnections 52a and 52b is available in the propagation direction of acoustic wave. As depicted by another broken line, a perpendicular bisector between the first interconnections 52a and 52b in the first region 62 coincides with that between the first connecting points 54a and 54b. Similarly, the second interconnections 56a and 56b have a second region 64 (surrounded by a broken line) in which the greatest distance between the second interconnections 56a and 56b is available in the propagation direction of acoustic wave. As depicted by another broken line, a perpendicular bisector between the second interconnections 56a and 56b in the second region 64 coincides with that between the second connecting points 58a and 58b.

It is assumed that L6 is the distance between the first interconnections 52a and 52b in the first region 62, and L7 is the distance between the second interconnections 56a and 56b in the second region 64. In this assumption, L3<L6 and L4<L7. Further, L6, L7 and L5 are approximately equal to each other. Thus, the first interconnections 52a and 52b are connected to the third connecting points 60a and 60b through routes having approximately equal lengths. Similarly, the second interconnections 56a and 56b are connected to the third connecting points 60a and 60b through routes having approximately equal lengths. According to the configuration shown in FIG. 17, the amplitude balance characteristic and the phase balance characteristic can be improved even if the distance between the interconnections is changed.

Figure 18:
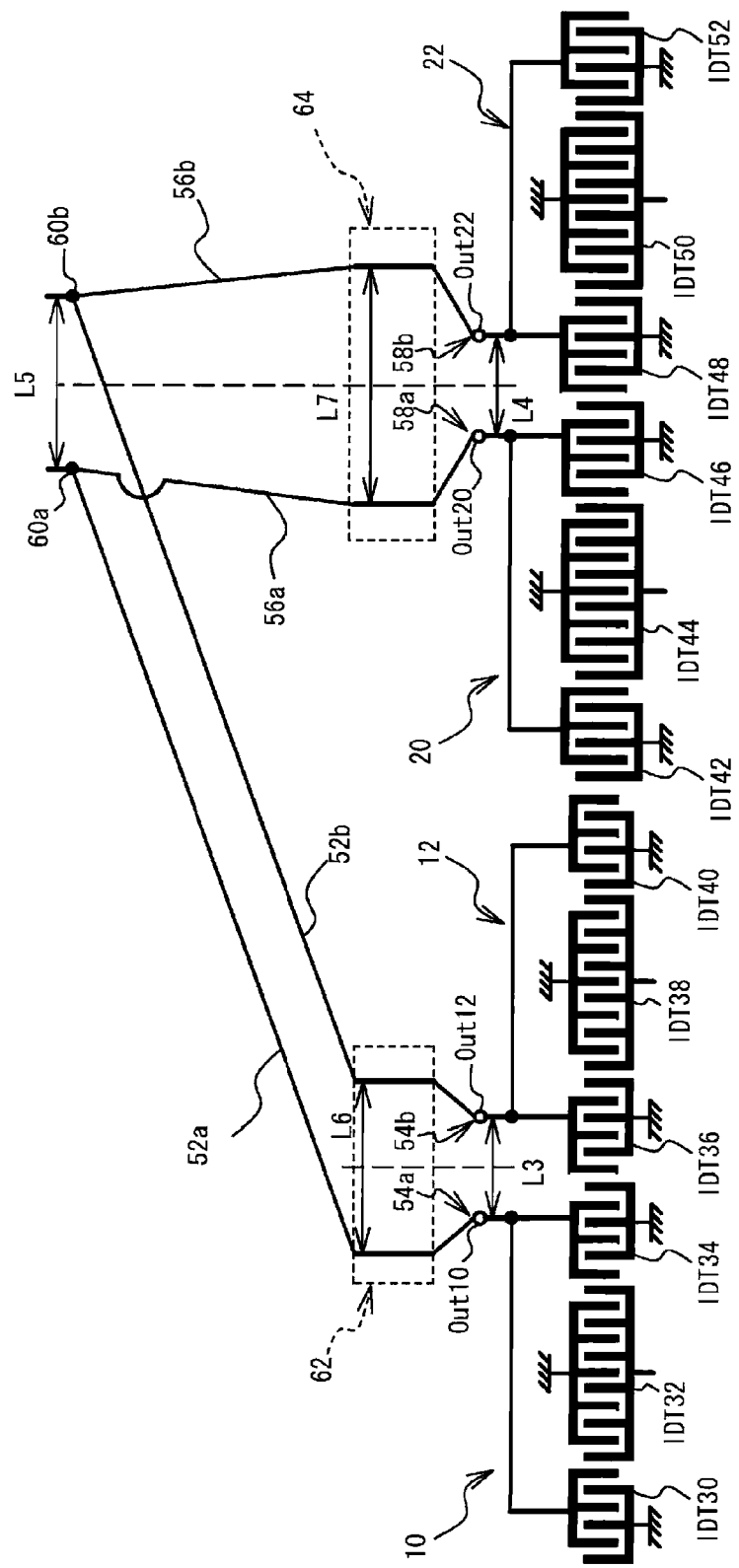
FIG. 18 is an enlarged view of yet another variation of the seventh embodiment.

FIG. 18 depicts yet another variation of the seventh embodiment. As depicted in FIG. 18, the distance L6 between the first interconnections 52a and 52b in the first region 62 is approximately equal to the distance L5 between the third connecting points 60a and 60b. Thus, the first interconnections 52a and 52b are connected to the third connecting points 60a and 60b through routes having approximately equal lengths. As depicted by a broken line, the perpendicular bisector between the second interconnections 56a and 56b in the second region 64 coincides with that between the third connecting points 60a and 60b. Thus, the second interconnections 56a and 56b are connected to the third connecting points 60a and 60b through routes having approximately equal to lengths. That is, according to the configuration shown in FIG. 18, the amplitude balance characteristic and the phase balance characteristic can be improved even if the distance between the interconnections is changed.

Eighth Embodiment

Figure 19A:
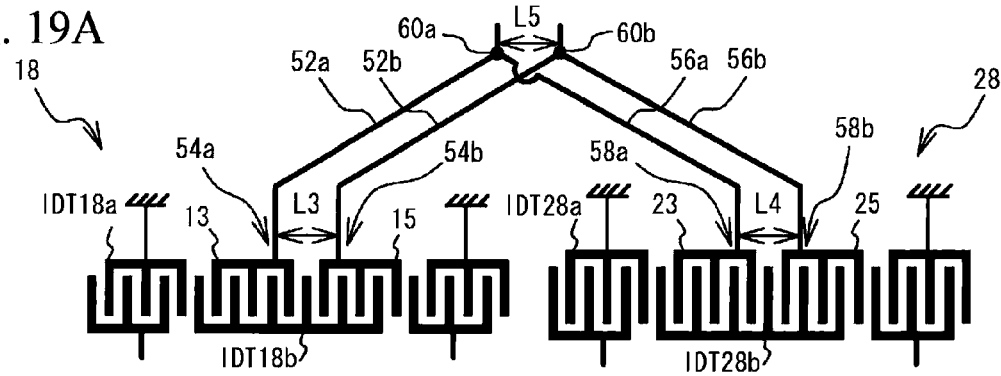
FIG. 19A is an enlarged view of an acoustic wave filter in accordance with an eight embodiment.

An eighth embodiment has an exemplary configuration in which each of the output IDTs of the first and second multimode filters has two divided bus bars and the distance between interconnections connected to the divided bus bars is adjusted. A basic configuration of an acoustic wave filter according to the eighth embodiment is similar to that depicted in FIG. 9. FIG. 19A is an enlarged view of a part related to the first multimode filter 18 and the second multimode filter 28 of the acoustic wave filter of the eighth embodiment. Reflectors R18 and R28 are omitted from illustration for the sake of simplicity. As has been described previously, the first multimode filter 18 and the second multimode filter have mutually different aperture lengths.

As depicted in FIG. 19A, the output IDT 18b of the first multimode filter 18 has two divided bus bars 13 and 15, and the output IDT 28b of the second multimode filter 28 has two divided bus bars 23 and 25. The bus bars 13 and 15 are connected to the first interconnections 52a and 52b at first connecting points 54a and 54b. Similarly, the bus bars 23 and 25 are connected to second interconnections 56a and 56b at second connecting points 58a and 58b. The first interconnections 52a and 52b are connected to the second interconnections 56a and 56b at the third connecting points 60a and 60b. The first interconnections 52a and 52b have approximately equal lengths, and the second interconnections 56a and 56b have approximately equal lengths.

In the exemplary configuration shown in FIG. 19A, the L3, L4 and L5 are approximately equal to each other where L3 is the distance between the first connecting points 54a and 54b, L4 is the distance between the second connecting points 58a and 58b, and L5 is the distance between the third connecting points 60a and 60b. Thus, the first interconnections 52a and 52b are connected to the third connecting points 60a and 60b through routes having approximately equal lengths. It is thus possible to improve the amplitude balance characteristic and the phase balance characteristic of the signals respectively output from the bus bars 13 and 15. Similarly, the second interconnections 56a and 56b are connected to the third connecting points 60a and 60b through routes having approximately equal lengths. It is thus possible to improve the amplitude balance characteristic and the phase balance characteristic of the signals respectively output from the bus bars 23 and 25. Thus, according to the eighth embodiment, it is possible to improve the amplitude balance characteristic and the phase balance characteristic of the acoustic wave filter.

Figure 19B:
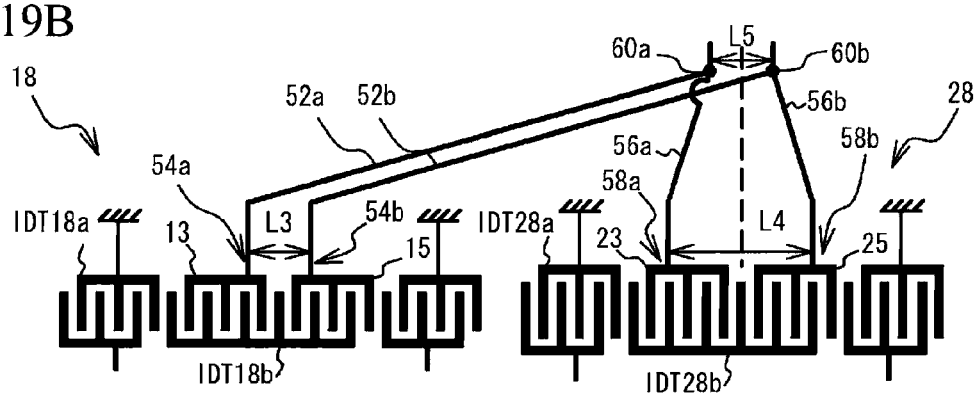
FIGS. 19B through 19D are respectively enlarged view of variations of the eighth embodiment.

FIG. 19B illustrates a variation of the eighth embodiment. As depicted in FIG. 19B, L3 is approximately equal to L5 where L3 is the distance between the first connecting points 54a and 54b and L5 is the distance between the third connecting points 60a and 60b. Thus, the first interconnections 52a and 52b are connected to the third connecting points 60a and 60b through routes having approximately equal lengths. As illustrated by a broken line, the perpendicular bisector between the second connecting points 58a and 58b coincides with that between the third connecting points 60a and 60b. Thus, the second interconnections 56a and 56b are connected to the third connecting points 60a and 60b through routes having approximately equal lengths. It is thus possible to improve the amplitude balance characteristic and the phase balance characteristic of the acoustic wave filter. According to the configuration depicted in FIG. 19B, the amplitude balance characteristic and the phase balance characteristic can be improved even if L3 and L4 are not equal to each other.

Figure 19C:
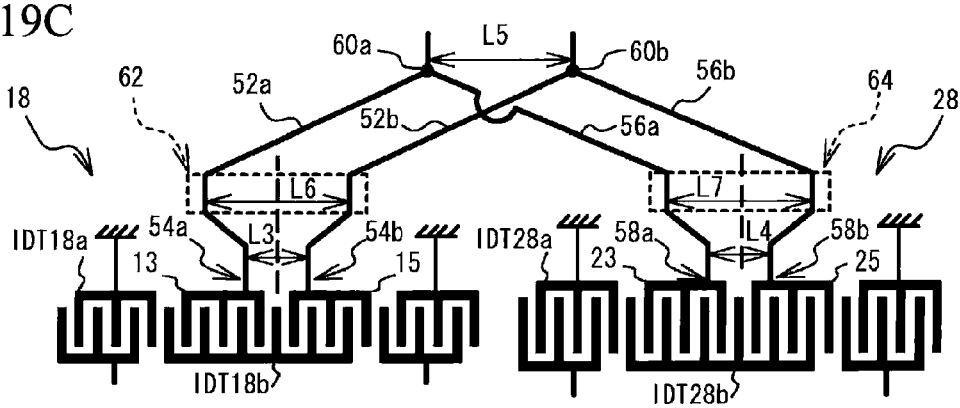

FIG. 19C illustrates yet another variation of the eighth embodiment. As depicted in FIG. 19C, the first interconnections 52a and 52b have the first region 62 (surrounded by a broken line) in which the greatest distance between the first interconnections 52a and 52b is available in the propagation direction of acoustic wave. As depicted by another broken line, the perpendicular bisector between the first connecting points 54a and 54b coincides with that between the first interconnections 52a and 52b in the first region 62. Similarly, the second interconnections 56a and 56b have the second region 64 (surrounded by a broken line) in which the greatest distance between the second interconnections 56a and 56b is available in the propagation direction of acoustic wave. As depicted by another broken line, the perpendicular bisector between the second interconnections 56a and 56b in the second region 64 coincides with that between the second connecting points 58a and 58b.

In the above-mentioned configuration, L3<L6 and L4<L7. In addition, L6, L7 and L5 are approximately equal to each other. Thus, the first interconnections 52a and 52b are connected to the third connecting points 60a and 60b through routes having approximately equal lengths. Similarly, the second interconnections 56a and 56b are connected to the third connecting points 60a and 60b through routes having approximately equal lengths. That is, according to the configuration shown in FIG. 19C, the amplitude balance characteristic and the phase balance characteristic can be improved even if the distance between the interconnections is changed.

Figure 19D:
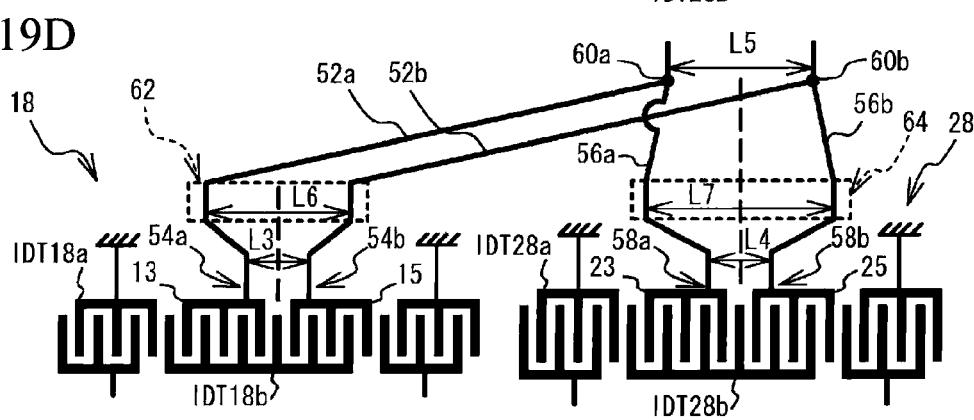

FIG. 19D illustrates a further variation of the eighth embodiment. As illustrated in FIG. 19D, L6 is approximately equal to L5 where L6 is the distance between the first interconnections 52a and 52b in the first region 62 and L5 is the distance between the third connecting points 60a and 60b. Thus, the first interconnections 52a and 52b are connected to the third connecting points 60a and 60b through routes having approximately equal lengths. As illustrated by the broken line, the perpendicular bisector between the second interconnections 56a and 56b in the second region 64 coincides with that between the third connecting points 60a and 60b. Thus, the second interconnections 56a and 56b are connected to the third connecting points 60a and 60b through routes having approximately equal lengths. That is, according to the configuration shown in FIG. 19D, the amplitude balance characteristic and the phase balance characteristic can be improved even if the distance between the interconnections is changed.

In the above-mentioned eighth embodiment, the first and second multimode filters have different aperture lengths. However, an identical aperture length may be employed. The first through eight embodiments and variations thereof may include not only the above-mentioned surface acoustic wave devices but also boundary acoustic or elastic wave devices.

The present invention is not limited to the specifically described embodiments and variations, but other embodiments and variations may be made within the scope of the present invention.

The invention claimed is:

1. An acoustic wave filter comprising:
a first acoustic wave filter having a first group of multimode filters connected, a first unbalanced input node and two first balanced output nodes, one or more first multimode filters among the first group of multimode filters being connected to the two first balanced output nodes; and
a second acoustic wave filter having a second group of multimode filters, a second unbalanced input node and two second balanced output nodes, one or more second multimode filters among the second group of multimode filters having an aperture length different from that of the first multimode filter and a connection with the two second balanced output nodes, the first and second multimode filters having different pass bands,
one of the two first balanced output nodes and one of the two second balanced output nodes being unified, and the other first balanced output node and the other second balanced output node being unified,
wherein the aperture length of the first multimode filter differs from the aperture length of the second multimode filter so that a signal having a frequency included within a pass band of the first acoustic wave filter does not pass through the second acoustic wave filter and a signal having a frequency included within a pass band of the second acoustic wave filter does not pass through the first acoustic wave filter.

2. The acoustic wave filter according to claim 1, wherein at least one of the first and second acoustic wave filters has an arrangement in which two multimode filters among the first or second group of multimode filters are connected to at least one of the first and second unbalanced input nodes in parallel, and two first or second multimode filters among the first or second group are respectively connected to said two multimode filters in series.

3. The acoustic wave filter according to claim 2, wherein the two first or second multimode filters have an identical aperture length.

4. The acoustic wave filter according to claim 2, wherein:
the first acoustic wave filter is configured so that two multimode filters among the first group of multimode filters are connected to the first unbalanced input node in parallel, and the two first multimode filters are respectively connected in series to the two multimode filters connected in parallel; and
the second acoustic wave filter is configured so that two multimode filters among the second group of multimode filters are connected to the second unbalanced input node, and the two second multimode filters are respectively connected in series to the two multimode filters connected in parallel.

5. The acoustic wave filter according to claim 4, wherein an interconnection connecting one of the two first balanced output nodes and one of the two second balanced output nodes and another interconnection connecting the other one of the two first balanced output nodes and the other one of the two second balanced output nodes do not cross each other.

6. The acoustic wave filter according to claim 5, wherein an interconnection connecting the first unbalanced input node and the two multimode filters connected in parallel in the first acoustic wave filter and another interconnection connecting the second unbalanced input node and the two multimode filters connected in parallel in the second acoustic wave filter cross each other.

7. The acoustic wave filter according to claim 5, wherein an interconnection connecting the first unbalanced input node and the two multimode filters connected in parallel in the first acoustic wave filter and another interconnection connecting the second unbalanced input node and the two multimode filters connected in parallel in the second acoustic wave filter do not cross each other.

8. The acoustic wave filter according to claim 2, wherein at least one of the first and second multimode filters has two divided bus bars, which are connected to the two first or second balanced output nodes.

9. The acoustic wave filter according to claim 8, wherein:
each of the first and second multimode filters has two divided bus bars;
two first interconnections are connected to the two divided bus bars of the first multimode filter at two first connecting points;
two second interconnections are connected to the two divided bus bars of the second multimode filter at two second connecting points; and
each of the two first interconnections are connected to each of the two second interconnections at each of two third connecting points.

10. The acoustic wave filter according to claim 1, wherein two multimode filters of the first group connected to the first unbalanced input node and/or two multimode filters of the second group connected to the second unbalanced input node have an identical aperture length.

11. The acoustic wave filter as claimed in claim 1, further comprising a matching circuit between a first unified node and a second unified node where the first unified node connects one of the two first balanced output nodes and one of the two second balanced output nodes, and the second unified node connects the other one of the two first balanced output nodes and the other one of the two second balanced output nodes.

12. The acoustic wave filter as claimed in claim 11, wherein the matching circuit includes an inductor.

13. The acoustic wave filter as claimed in claim 1, wherein the first and second acoustic wave filters have an identical piezoelectric substrate.

14. The acoustic wave filter according to claim 1, wherein:
two first interconnections are connected to the two first balanced output nodes at two first connecting points;
two second interconnections are connected to the two second balanced output nodes at two second connecting points; and
each of the two first interconnections are connected to each of the two second interconnections at each of two third connecting points.

15. The acoustic wave filter according to claim 14, wherein a distance between the two first connecting points, a distance between the two second connecting points and a distance between the two third connecting points are substantially identical to each other.

16. The acoustic wave filter according to claim 14, wherein:
a distance between the two first connecting points is approximately equal to that between the two third connecting points; and
a perpendicular bisector between the two second connecting points coincides with that between the two third connecting points.

17. The acoustic wave filter according to claim 14, wherein:
a distance between the first interconnections in a first region in which a greatest distance between the first interconnections is available is greater than the distance between the two first connecting points;
a perpendicular bisector between the two first connecting points coincides with that between the first interconnections in the first region;
a distance between the second interconnections in a second region in which a greatest distance between the second interconnections is available is greater than the distance between the two second connecting points; and
a perpendicular bisector between the two second connecting points coincides with that between the second interconnections in the second region.

18. The acoustic wave filter according to claim 17, wherein a distance between the two first interconnections in the first region, a distance in the second interconnections in the second regions, and a distance between the two third connecting points are approximately equal to each other.

19. The acoustic wave filter according to claim 17, wherein:
the distance between the two first interconnections in the first region is approximately equal to the distance between the two third connecting points; and
the perpendicular bisector between the second interconnections in the second region coincides with that between the two third connecting points.

20. The acoustic wave filter according to claim 14, wherein the two first interconnections have an approximately equal length, and the two second interconnections have an approximately equal length.

* * * * *